United States Patent [19]
Goto et al.

[11] Patent Number: 5,608,752
[45] Date of Patent: Mar. 4, 1997

[54] SEMICONDUCTOR LASER DEVICE AND METHOD OF DESIGNING THE SAME

[75] Inventors: Takenori Goto, Neyagawa; Nobuhiko Hayashi, Osaka; Teruaki Miyake, Tottori; Mitsuaki Matsumoto, Osaka; Kenichi Matsukawa, Sumoto; Daisuke Ide; Koutarou Furusawa, both of Higashiosaka; Akira Ibaraki, Hirakata; Keiichi Yodoshi, Kawachinagano; Tatsuya Kunisato, Takatsuki, all of Japan

[73] Assignee: Sanyo Electric Co., Ltd., Osaka-fu, Japan

[21] Appl. No.: 430,497

[22] Filed: Apr. 28, 1995

[30] Foreign Application Priority Data

Apr. 28, 1994 [JP] Japan .................................. 6-092306
Mar. 22, 1995 [JP] Japan .................................. 7-062265

[51] Int. Cl.$^6$ ........................................................ H01S 3/19
[52] U.S. Cl. ................................................ 372/46; 372/45
[58] Field of Search ......................................... 372/45, 46

[56] References Cited

U.S. PATENT DOCUMENTS

| | | | |
|---|---|---|---|
| 4,815,089 | 3/1989 | Miyauchi et al. | 372/49 |
| 4,961,197 | 10/1990 | Tanaka et al. | 372/45 |
| 5,022,036 | 6/1991 | Suyama et al. | 372/45 |
| 5,416,790 | 5/1995 | Yodoshi et al. | 372/46 |

FOREIGN PATENT DOCUMENTS

| | | |
|---|---|---|
| 61-84891 | 4/1986 | Japan . |
| 61-171186 | 8/1986 | Japan . |
| 63-202083 | 8/1988 | Japan . |
| 2-72688 | 3/1990 | Japan . |
| 7-22695 | 6/1993 | Japan . |
| 6-196810 | 7/1994 | Japan . |
| 6-260716 | 9/1994 | Japan . |

OTHER PUBLICATIONS

IEEE Journal of Quantum Electronics, vol. 29, No. 6, Jun. 1993, 600 MWCW Single–Mode GaA1As Triple–Quantum–Well Laser With a New Index Guided Structure, pp. 1889–1894.

Extended Abstracts (The 41st Spring Meeting, 1994); The Japan Society of Applied Physics and Related Societies, 28p–K–6, Mar. 28, 1994.

Extended Abstracts (The 54th Autumn Meeting, 1993); The Japan Society of Applied Physics and Related Societies, 30a–H–6, Sep. 27, 1993.

Extended Abstracts (The 40th Spring Meeting, 1993); The Japan Society of Applied Physics and Related Societies, 1a–C–6, Mar. 29, 1993.

Extended Abstracts (The 53rd Autumn Meeting, 1992); The Japan Society of Applied Physics and Related Societies, 17a–V–1, Sep. 16, 1992.

Extended Abstracts (The 53rd Autumn Meeting, 1992); The Japan Society of Applied Physics and Related Societies, 17a–V–2, Sep. 16, 1992.

Applied Physics Letters 65, pp. 1211–1212, Sep. 5, 1994.

(List continued on next page.)

*Primary Examiner*—James W. Davie
*Attorney, Agent, or Firm*—Darby & Darby, P.C.

[57] ABSTRACT

In a semiconductor laser device comprising an n-type cladding layer, an active layer formed on the cladding layer, a p-type cladding layer formed on the active layer, and a p-type saturable light absorbing layer provided in the p-type cladding layer, the current confinement width for confining current injected into the active layer being W, the thickness $d_a$ of the active layer, the optical confinement factor $\Gamma_a$ of the active layer, the thickness $d_s$ of the saturable light absorbing layer, the optical confinement factor $\Gamma_s$ of the saturable light absorbing layer, and the light spot size S on a facet of the semiconductor laser device are so set as to satisfy a predetermined relationship. The reflectivity on a light output facet is set in the range of 10 to 20%.

27 Claims, 14 Drawing Sheets

OTHER PUBLICATIONS

Extended Abstracts (The 41st Spring Meeting, 1994); The Japan Society of Applied Physics and Related Societies, 28p–K–9, Mar. 28, 1994.

Extended Abstracts (The 55th Autumn Meeting, 1994); The Japan Society of Applied Physics and Related Societies, 20a–S–6, Sep. 19, 1994.

The 12th Semiconductor Laser Symposium, Mar. 3, 1995.

Extended Abstracts (The 42nd Spring Meeting, 1995); The Japan Society of Applied Physics and Related Societies, Mar. 28, 1995.

SEMICONDUCTOR LASER DEVICE AND METHOD OF DESIGNING THE SAME

CROSS-REFERENCE TO RELATED APPLICATION

This application is related to application Ser. No. 08/147,779, filed Nov. 4, 1993, now U.S. Pat. No. 5,416,790 granted May 16, 1995 commonly assigned with the present invention.

BACKGROUND OF THE INVENTION

1. Field of the Invention

The present invention relates to semiconductor laser devices, and more particularly, to a semiconductor laser device capable of reducing noises due to optical feedback of output laser light and a method of designing the same.

2. Description of the Prior Art

In a conventional semiconductor laser device, if optical feedback of output laser light is incident again on a semiconductor laser device, noises due to the optical feedback (hereinafter referred to as optical feedback noises) are generated within the output laser light. If the semiconductor laser device is used as a light source of an optical disk system, for example, optical feedback of output laser light by reflection from a disk surface or the like is incident again on the semiconductor laser device, thereby to generate such optical feedback noises.

In order to reduce the optical feedback noises of the semiconductor laser device, a method utilizing self-sustained pulsation phenomena has been known. For example, a self-sustained pulsation type semiconductor laser device comprising a layer having approximately the same composition as that of an active layer and having saturable light absorbing characteristics with respect to lasing light (a saturable light absorbing layer) is disclosed in Japanese Patent Laying-Open No. 84891/1986 (H01S 3/18), for example. In addition, a semiconductor laser device in which a saturable light absorbing layer is laminated on an active layer excluding a stripe-shaped region in its center is disclosed in Japanese Patent Laying-Open No. 171186/1986 (H01S 3/18). A lasing spectrum causes self-sustained pulsation by the saturable light absorbing layer, whereby the coherence is lowered, thereby to reduce optical feedback noises.

A semiconductor laser device used as a light source of an optical disk system requires low-noise characteristics at the time of reproduction, while requiring high-power characteristics at the time of recording. In a general optical disk system, light output power of 3 mW is required at the time of reproduction, while light output power of 30 mW is required at the time of recording.

However, the semiconductor laser device may not stably carry out the self-sustained pulsation only by the above described construction. Further, in the above described self-sustained pulsation type semiconductor laser device, a kink level (a light output power level at which a kink appears in light output power-current characteristics) is lowered by the saturable light absorbing layer introduced so as to generate the self-sustained pulsation, thereby to make it impossible to select both self-sustained pulsation and high-power lasing.

In the semiconductor laser device having the saturable light absorbing layer, the lower the reflectivity on a light output facet is, the more advantageously higher power is realized. In the conventional self-sustained pulsation type high-power semiconductor laser device, therefore, the reflectivity on a light output facet is set to not more than 5%. In the conventional self-sustained pulsation type high-power semiconductor laser device, however, optical feedback noise characteristics are liable to be degraded when the optical feedback ratio (the ratio of the light quantity of optical feedback to the light quantity of output laser light) is in the-vicinity of 0.1%.

SUMMARY OF THE INVENTION

An object of the present invention is to provide a semiconductor laser device which can generate stable self-sustained pulsation and a method of designing the same.

Another object of the present invention is to provide a semiconductor laser device capable of selecting both self-sustained pulsation and high-power lasing and a method of designing the same.

Still another object of the present invention is to provide a semiconductor laser device having good optical feedback noise characteristics which are not dependent on the optical feedback ratio and capable of performing high-power operation.

In a method of designing a semiconductor laser device comprising a cladding layer of a first conductivity type, an active layer which is formed on the cladding layer of a first conductivity type and into which current confined to a width W is injected, a cladding layer of a second conductivity type formed on the active layer, and a saturable light absorbing layer provided in at least one of both the cladding layers, the method of designing a semiconductor laser device according to the present invention is characterized in that the thickness $d_a$ of the active layer, the optical confinement factor $\Gamma_a$ of the active layer, the thickness $d_s$ of the saturable light absorbing layer, the optical confinement factor $\Gamma_s$ of the saturable light absorbing layer, the current confinement width W, and the light spot size S on a facet of the semiconductor laser device are so set as to obtain stable self-sustained pulsation.

Letting a, b, c, d, e and f be positive constants, the thickness $d_a$ of the active layer, the optical confinement factor $\Gamma_a$ of the active layer, the thickness $d_s$ of the saturable light absorbing layer, the optical confinement factor $\Gamma_s$ of the saturable light absorbing layer, the current confinement width W, and the light spot size S may be set in a range enclosed by straight lines indicated by equations (A) to (D):

$$y = -ax + b \quad \text{(A)}$$

$$y = -cx + d, \ (a > c, \ b > d) \quad \text{(B)}$$

$$y = e \quad \text{(C)}$$

$$x = f \quad \text{(D)}$$

where $y = (S-W)/W$, $x = (\Gamma_s/d_s)/(\Gamma_a/d_a)$.

It is preferable that the thickness $d_a$ of the active layer, the optical confinement factor $\Gamma_a$ of the active layer, the thickness $d_s$ of the saturable light absorbing layer, the optical confinement factor $\Gamma_s$ of the saturable light absorbing layer, the current confinement width W, and the light spot size S are set in a range enclosed by straight lines indicated by equations (1) to (4):

$$y = -5x + 1.3, \ (x \leq 0.25) \quad (1)$$

$$y = -(1/25)x + 3/50, \ (0.25 \leq x \leq 1) \quad (2)$$

$$y = 0.6 \quad (3)$$

$$x=1 \quad (4)$$

where $y=(S-W)/W$, $x=(\Gamma_s/d_s)/(\Gamma_a/d_a)$.

It is more preferable that the thickness $d_a$ of the active layer, the optical confinement factor $\Gamma_a$ of the active layer, the thickness $d_s$ of the saturable light absorbing layer, the optical confinement factor $\Gamma_s$ of the saturable light absorbing layer, the current confinement width W, and the light spot size S are set in a range enclosed by straight lines indicated by equations (5) to (8):

$$y=-5x+1.35, (x \leq 0.25) \quad (5)$$

$$y=-(1/15)x+7/60, (0.25 \leq x \leq 1) \quad (6)$$

$$y=0.6 \quad (7)$$

$$x=1 \quad (8)$$

where $y=(S-W)/W$, $x=(\Gamma_s/d_s)/(\Gamma_a/d_a)$.

The thickness $d_a$ of the active layer, the optical confinement factor $\Gamma_a$ of the active layer, the thickness $d_s$ of the saturable light absorbing layer, the optical confinement factor $\Gamma_s$ of the saturable light absorbing layer, the current confinement width W, and the light spot size S are thus so set as to satisfy a predetermined relationship, whereby the semiconductor laser device can stably generate self-sustained pulsation at not more than a predetermined γ value.

Particularly, it is preferable that the width of the saturable light absorbing layer is so set as to be smaller than the width of the active layer. Thus, in a direction parallel to the junction plane, the effective refractive index in a region having the saturable light absorbing layer is increased, and the optical density of the saturable light absorbing layer is increased, whereby the effect of the saturable light absorbing layer is heightened. Therefore, the frequency of the self-sustained pulsation is decreased, thereby to make the self-sustained pulsation possible up to higher light output power. Moreover, in such a case, a transverse mode becomes stable up to higher light output power because the effective refractive index in the region having the saturable light absorbing layer is increased in the direction parallel to the junction plane, thereby to make it possible to achieve higher power.

It is preferable that the thickness of the active layer is set to not more than 0.1 μm. It is more preferable that the thickness of the active layer is set to not less than 0.035 μm not more than 0.1 μm. The thickness of the active layer is decreased, thereby to make higher light output power possible without decreasing the kink level, without damaging the self-sustained pulsation.

If the cladding layer of a first conductivity type comprises an $Al_xGa_{1-x}As$ cladding layer of a first conductivity type, the cladding layer of a second conductivity type comprises an $Al_xGa_{1-x}As$ first cladding layer formed on the active layer and an $Al_xGa_{1-x}As$ second cladding layer of a second conductivity type constituting a stripe-shaped ridge portion formed on the first cladding layer, the saturable light absorbing layer comprises a saturable light absorbing layer of a second conductivity type formed between the first cladding layer and the second cladding layer, and the semiconductor laser device further comprises a current blocking layer of a first conductivity type provided on a side surface of the ridge portion and on the saturable light absorbing layer, it is preferable that the thickness $d_a$ of the active layer, the thickness $d_s$ of the saturable light absorbing layer, and the thickness $t_c$ of the first cladding layer are set in a range enclosed by straight lines indicated by equations (9) to (13):

$$t_c=0.45 \quad (9)$$

$$d_s/d_a=0.8 \quad (10)$$

$$t_c=-(3/5) \times (d_s/d_a)+7/10, d_s/d_a \leq 0.6 tm \quad (11)$$

$$t_c=-(1/10) \times (d_s/d_a)+2/5, 0.6 \leq d_s/d_a \leq 0.8 \quad (12)$$

$$t_c=-(1/2) \times (d_s/d_a)+3/4, 0.6 \leq d_s/d_a \leq 0.8 \quad (13)$$

It is preferable that the thickness of the active layer is not less than 0.04 μm not more than 0.06 μm, and the composition ratio X in the cladding layer of a first conductivity type is not less than 0.4 not more than 0.6.

The thickness $d_a$ of the active layer, the thickness $d_s$ of the saturable light absorbing layer, and the thickness $t_c$ of the first cladding layer are so set as to satisfy a predetermined relationship, whereby the self-sustained pulsation can be stably generated at not more than a predetermined γ value, and operating current is reduced.

In accordance with another aspect of the present invention, a semiconductor laser device comprises an $Al_xG_{1-x}As$ cladding layer of a first conductivity type, an active layer formed on the cladding layer of a first conductivity type, an $Al_xGa_{1-x}As$ first cladding layer of a second conductivity type formed on the active layer, a saturable light absorbing layer of a second conductivity type formed on the first cladding layer, an $Al_xGa_{1-x}As$ second cladding layer of a second conductivity type constituting a stripe-shaped ridge portion formed on the saturable light absorbing layer, and a current blocking layer of a first conductivity type provided on a side surface of the ridge portion and on the saturable light absorbing layer, the thickness $d_a$ of the active layer, the thickness $d_s$ of the saturable light absorbing layer, and the thickness $t_c$ of the first cladding layer satisfying conditions in the range enclosed by the straight lines indicated by the foregoing equations (9) to (13), the thickness $d_a$ of the active layer being not less than 0.04 μm not more than 0.06 μm, and the composition ratio X in the cladding layer of a first conductivity type being not less than 0.4 not more than 0.6.

In accordance with still another aspect of the present invention, a semiconductor laser device comprises a cladding layer of a first conductivity type, an active layer formed on the cladding layer of a first conductivity type, a cladding layer of a second conductivity type comprising a flat portion formed on the active layer and a stripe-shaped ridge portion formed on a part of the flat portion, and a saturable light absorbing layer provided in the ridge portion or between the ridge portion and the flat portion and having a smaller width than that of the active layer.

In this semiconductor laser device, the thickness $d_a$ of the active layer, the optical confinement factor $\Gamma_a$ of the active layer, the thickness $d_s$ of the saturable light absorbing layer, the optical confinement factor $\Gamma_s$ of the saturable light absorbing layer, the current confinement width W, and the light spot size S on a facet of the semiconductor laser device satisfy conditions in the range enclosed by the straight lines indicated by the foregoing equations (1) to (4).

In this semiconductor laser device, the saturable light absorbing layer having a smaller width than that of the active layer is provided in the ridge portion or between the ridge portion and the flat portion. Accordingly, the difference between the effective refractive index under the ridge portion and the effective refractive index under the flat portion becomes greater, as compared with a case where a saturable light absorbing layer having the same width as that of the active layer is provided in the cladding layer of a second conductivity type or between the ridge portion and the flat portion. Consequently, the astigmatism can be decreased while realizing low-noise characteristics, so that a transverse mode becomes more stable.

It is more preferable that the thickness $d_a$ of the active layer, the optical confinement factor $\Gamma_a$ of the active layer, the thickness $d_s$ of the saturable light absorbing layer, the optical confinement factor $\Gamma_s$ of the saturable light absorbing layer, the current confinement width W, and the light spot size S on the facet of the semiconductor laser device satisfy conditions in the range enclosed by the straight lines indicated by the foregoing equations (5) to (8).

Since the thickness $d_a$ of the active layer, the optical confinement factor $\Gamma_a$ of the active layer, the thickness $d_s$ of the saturable light absorbing layer, the optical confinement factor $\Gamma_s$ of the saturable light absorbing layer, the current confinement width W, and the light spot size S satisfy a predetermined relationship, the semiconductor laser device can stably generate self-sustained pulsation at not more than a predetermined $\gamma$ value.

The cladding layer of a first conductivity type, the cladding layer of a second conductivity type, and the active layer may be respectively composed of $Al_xGa_{1-x}As$, $Al_xGa_{1-x}As$, and $Al_YGa_{1-Y}As$ ($0 \leq Y < X < 1$).

It is preferable that the thickness of the active layer is not more than 0.1 μm. It is more preferable that the thickness of the active layer is not less than 0.035 μm not more than 0.1 μm. The thickness of the active layer is decreased, thereby to make it possible to achieve higher light output power possible without lowering the kink level, without damaging the self-sustained pulsation.

It is preferable that the semiconductor laser device further comprises an etching stop layer of a second conductivity type formed on the saturable light absorbing layer.

It is preferable that a current blocking layer having a larger band gap than that of the cladding layer of a second conductivity type is further provided on a side surface of the ridge portion and on the flat portion. Since lasing light is not absorbed by the current blocking layer, therefore, it is considered that the current blocking layer does not cause the loss in light lasing. In such a case, therefore, lower threshold current, higher efficiency and higher power can be achieved. Moreover, in this construction, the thickness of the flat portion of the cladding layer having a ridge structure can be considerably decreased, thereby to make it possible to reduce unavailing current flowing through the flat portion. As a result, operating current can be significantly reduced, and the maximum light output power is improved.

It is preferable that the reflectivity on a light output facet of the semiconductor laser device is not less than 10% not more than 20%. Consequently, good optical feedback noise characteristics which are not dependent on the optical feedback ratio and high-power characteristics are obtained.

In accordance with a further aspect of the present invention, a semiconductor laser device comprises a cladding layer of a first conductivity type, an active layer formed on the cladding layer of a first conductivity type, a cladding layer of a second conductivity type comprising a flat portion formed on the active layer and a stripe-shaped ridge portion formed on a part of the flat portion, a saturable light absorbing layer provided in at least one of the cladding layer of a first conductivity type and the cladding layer of a second conductivity type, and a current blocking layer of a first conductivity type provided on a side surface of the ridge portion and on the flat portion and having a larger band gap than that of the cladding layer of a second conductivity type.

The cladding layer of a second conductivity type, the active layer, and the current blocking layer may be respectively composed of $Al_xGa_{1-x}As$, $Al_YGa_{1-Y}As$, and $Al_ZGa_{1-Z}As$, and $0 \leq Y < X < Z < 1$ may be satisfied.

The semiconductor laser device may further comprise an anti-oxidation layer of a first conductivity type formed on the current blocking layer.

In this semiconductor laser device, the current blocking layer has a larger band gap than that of the cladding layer of a second conductivity type. Accordingly, lasing light is not absorbed by the current blocking layer, whereby the current blocking layer does not cause the loss in light lasing. Consequently, lower threshold current, higher efficiency and higher power can be achieved. Moreover, the thickness of the flat portion of the cladding layer having a ridge structure can be considerably decreased, thereby to make it possible to reduce unavailing current flowing through the flat portion. As a result, operating current can be significantly reduced while realizing low-noise characteristics, and the maximum light output power is improved.

It is preferable that the reflectivity on a light output facet of the semiconductor laser device is not less than 10% not more than 20%. Therefore, good optical feedback noise characteristics which are not dependent on the optical feedback ratio and high-power characteristics are obtained.

In accordance with a still further aspect of the present invention, a semiconductor laser device comprises a cladding layer of a first conductivity type, an active layer formed on the cladding layer of a first conductivity type, a cladding layer of a second conductivity type formed on the active layer, and a saturable light absorbing layer provided in at least one of the cladding layer of a first conductivity type and the cladding layer of a second conductivity type, the reflectivity on a light output facet being set to not less than 10% not more than 20%. Therefore, good optical feedback noise characteristics which are not dependent on the optical feedback ratio and high-power characteristics are obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in detail with reference to the drawings.

Figure 1:
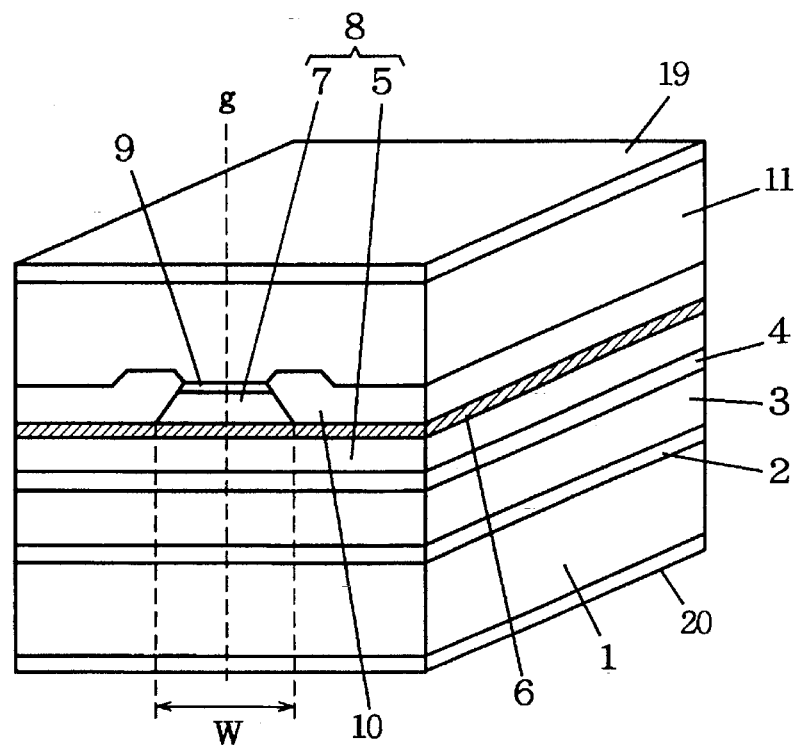
FIG. 1 is a perspective view showing a semiconductor laser device according to a first embodiment of the present invention.

FIG. 1 is a perspective view showing the structure of an AlGaAs system semiconductor laser device according to a first embodiment of the present invention. In FIG. 1, an n-type GaAs buffer layer 2 having a thickness of 1 μm, an n-type $Al_xGa_{1-x}As$ cladding layer 3 having a thickness of 1 to 1.5 μm, an undoped $Al_YGa_{1-Y}As$ (1>X>Y≦0) active layer 4 having a thickness of 0.04 to 0.06 μm, and a p-type $Al_xGa_{1-x}As$ first cladding layer 5 having a thickness of 0.3 to 0.45 μm are successively formed on an n-type GaAs substrate 1. The Al composition ration Y in the $Al_YGa_{1-Y}As$ active layer 4 is 0.14, for example, and the Al composition ratio X in the p-type $Al_xGa_{1-x}As$ first cladding layer 5 is not less than approximately 0.4 not more than approximately 0.6.

A p-type $Al_ZGa_{1-Z}As$ saturable light absorbing layer 6 having a band gap of energy approximately equal to energy h ν of lasing light (h is a Planck's constant, and ν is the oscillation frequency of lasing light) is formed on the p-type $Al_xGa_{1-x}As$ first cladding layer 5. The Al composition ratio Z in the p-type $Al_ZGa_{1-Z}As$ saturable light absorbing layer 6 is approximately equal to the Al composition ratio Y in the $Al_YGa_{1-Y}As$ active layer 4, and Z=0.10 to 0.15.

A p-type $Al_xGa_{1-x}As$ second cladding layer 7 having a thickness of 0.6 to 1 μm which constitutes a stripe-shaped ridge portion is formed about the center on the p-type $Al_ZGa_{1-Z}As$ saturable light absorbing layer 6. The width W of the lower surface of the ridge portion of the second cladding layer 7 (the current confinement width) W is 2.5 to 5.5 μm.

In this structure, the p-type saturable light absorbing layer 6 is provided in a p-type cladding layer 8 having a thickness of 0.9 to 1.45 μm which comprises the p-type first and second cladding layers 5 and 7. The saturable light absorbing layer 6 has a band gap of energy approximately equal to energy of lasing light, and the second cladding layer 7 has a band gap of energy larger than energy of lasing light. Specifically, the Al composition ratio Z in the saturable light absorbing layer 6 is smaller than the Al composition ratio X in the second cladding layer 7. In the fabricating processes, therefore, the saturable light absorbing layer 6 can be used as an etching stop layer in etching the second cladding layer 7 in a ridge shape utilizing the etching selectivity based on the difference in the Al composition ratio.

A p-type GaAs cap layer 9 having a thickness of 0.3 μm, for example, is formed on the p-type $Al_xGa_{1-x}As$ second cladding layer 7, and an n-type GaAs current blocking layer 10 having a thickness of 0.8 μm is formed on the saturable light absorbing layer 6 so as to bury the second cladding layer 7 and the p-type GaAs cap layer 9. A p-type GaAs contact layer 11 having a thickness of 6 μm is formed on the p-type GaAs cap layer 9 and the n-type GaAs current blocking layer 10. A p-side electrode 19 is formed on the upper surface of the p-type GaAs contact layer 11, and an n-side electrode 20 is formed on the lower surface of the n-type GaAs substrate 1.

In order to examine the degree of self-sustained pulsation of the semiconductor laser device of the above described structure, the thicknesses or the composition ratios of the n-type cladding layer 3, the active layer 4, the p-type first cladding layer 5, the p-type saturable light absorbing layer 6 and the p-type second cladding layer 7, and the width of the lower surface of the ridge portion (the current confinement width) W were changed in the above described range to prepare a plurality of samples, and the value of injected current was suitably selected, to measure a γ value (the degree of the coherence of laser beam) at light output power of 3 mW.

The γ value represents the degree of the self-sustained pulsation (the coherence of laser beam). The self-sustained pulsation is not carried out if γ=1, and the self-sustained pulsation characteristics are increased as γ approaches zero. Experiments conducted by the inventors of the present application proved that a good value of the carrier to noise ratio (C/N) is obtained at a γ value of not more than 0.8 if the semiconductor laser device is carried on an optical disk system using a digital signal, for example, a magneto-optical disk system or a compact disk (CD) system, while a good value of C/N is obtained at a γ value of not more than 0.6 if the semiconductor laser device is carried on an optical disk system using an analog signal, for example, a laser disk (LD) system.

From the above described results of measurements, it was found that selection of the light spot size S on the light output facet of the semiconductor laser device, the current confinement width W, the thickness $d_a$ of the active layer 4, the optical confinement factor $\Gamma_a$ of the active layer 4, the thickness $d_s$ of the saturable light absorbing layer 6, and the optical confinement factor $\Gamma_s$ of the saturable light absorbing layer 6 is important in order to obtain good self-sustained pulsation, as described below.

Figure 2:
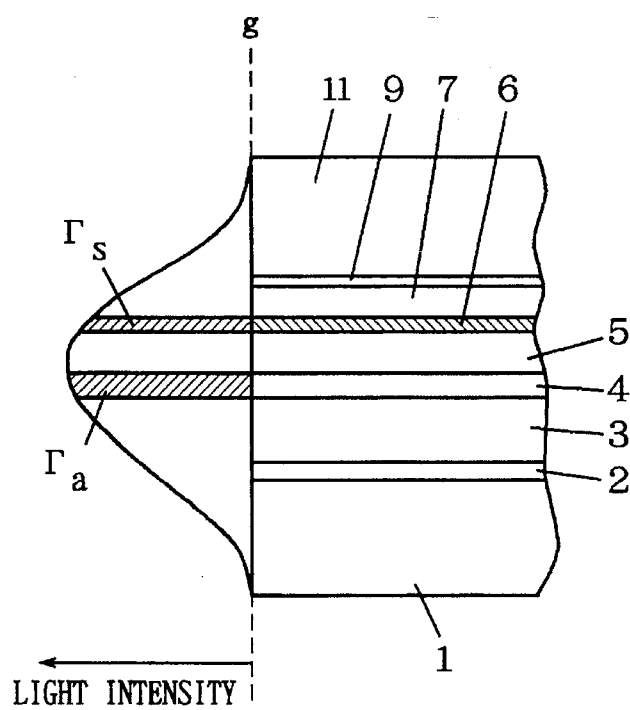
FIG. 2 is a diagram for explaining optical confinement factors $\Gamma_a$ and $\Gamma_s$.

The optical confinement factor $\Gamma_a$ means the ratio of the quantity of light confined in the active layer 4 to the entire quantity of light emitted from the light output facet (which is standardized as one herein) on a straight line g shown in FIG. 1, and the optical confinement factor $\Gamma_s$ means the ratio of the quantity of light confined in the saturable light absorbing layer 6 to the entire quantity of light emitted from the light output facet on the straight line g. The straight line g is a straight line perpendicular to the junction plane on the light output facet and dividing the current confinement width W into two equal parts. The optical confinement factors $\Gamma_a$ and $\Gamma_s$ are obtained from the area of a near-field pattern on the straight line g perpendicular to the junction plane and dividing the current confinement width W into two equal parts, as shown in FIG. 2.

Figure 3:
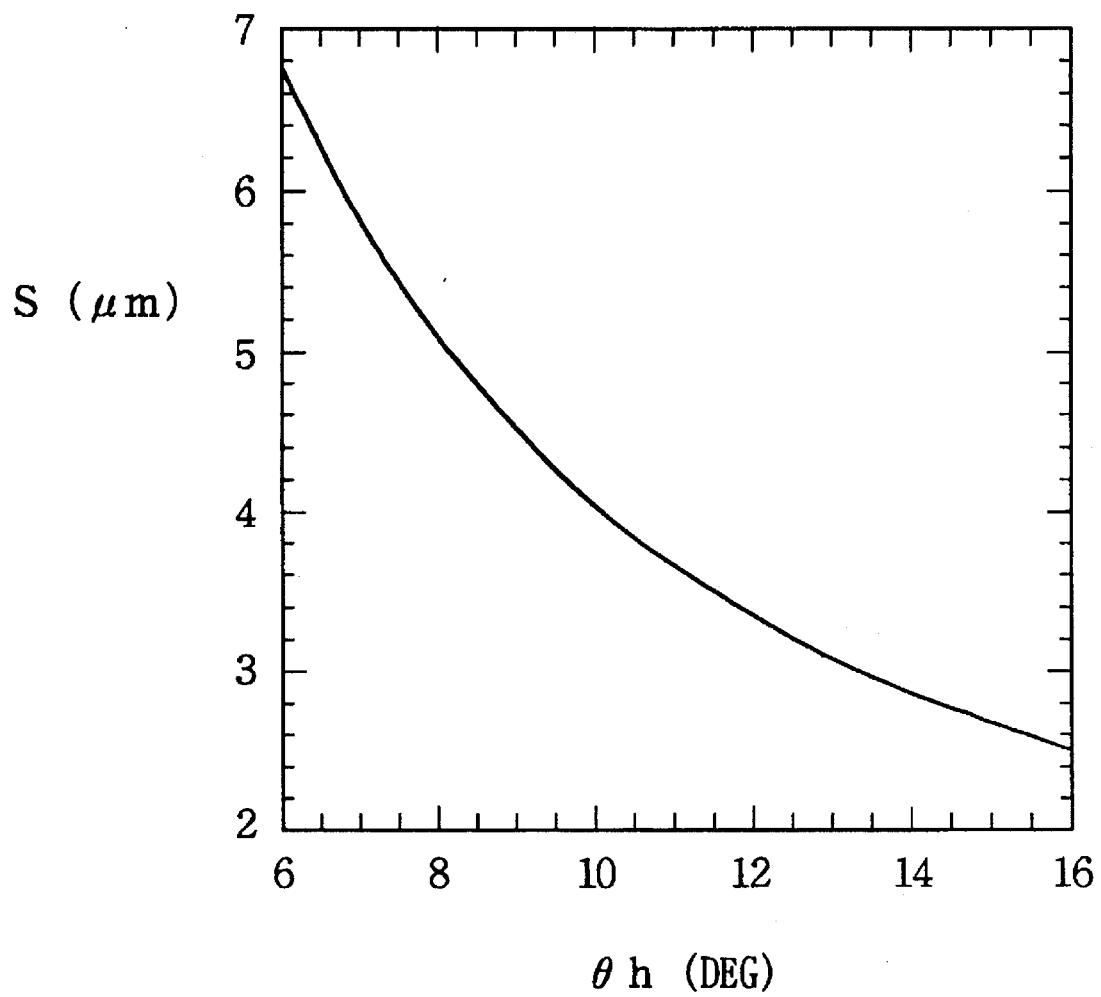
FIG. 3 is a diagram showing the relationship between the beam divergence $\theta_h$ in the direction parallel to the junction plane and the light spot size S.

As shown in FIG. 3, the light spot size S has a fixed relationship with the beam divergence $\theta_h$ in the direction parallel to the junction plane obtained from measurements of a far-field pattern, whereby it can be found from the measured beam divergence $\theta_h$.

Figure 4:
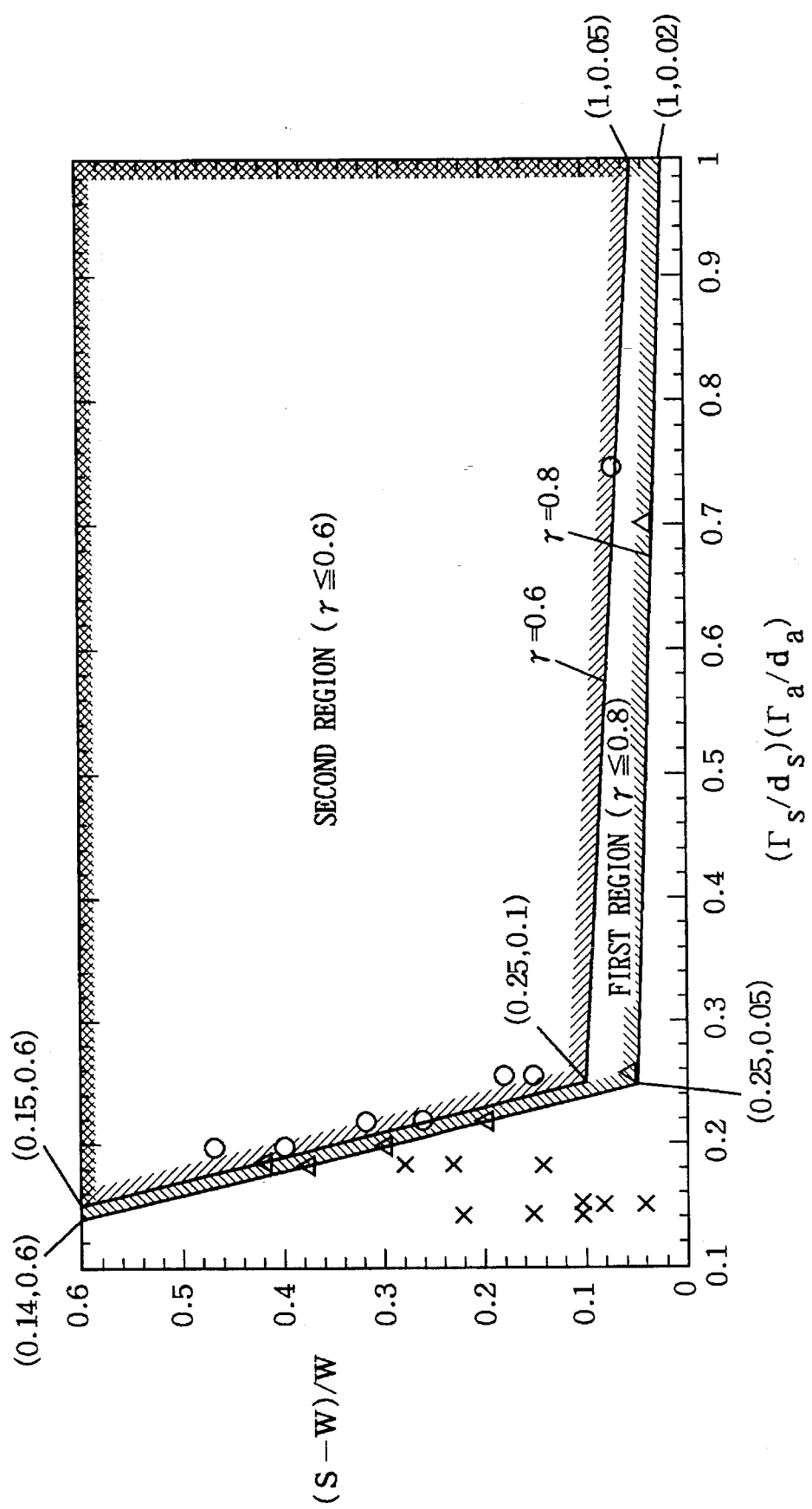
FIG. 4 is a diagram showing a region where $\gamma \leq 0.8$ and $\gamma \leq 0.6$ are obtained.

FIG. 4 is a diagram showing the relationship between parameters of respective samples obtained from the above described results of the measurements and the θ value. The vertical axis of the graph in FIG. 4 is (S−W)/W, and the horizontal axis thereof is $(\Gamma_s/d_s)/(\Gamma_a/d_a)$. In FIG. 4, a mark x indicates a sample having a γ value of more than 0.8, a mark Δ indicates a sample having a γ value of more than 0.6 and not more than 0.8, and a mark ○ indicates a sample of not more than 0.6.

In the graph of FIG. 4, a first region satisfying γ≦0.8 and a second region satisfying γ≦0.6 can be determined. The first region is within a range enclosed by straight lines indicated by the following equation (1) to (4):

$$y=-5x+1.3, (x\leq 0.25) \tag{1}$$

$$y=-(1/25)x+3/50, (0.25\leq x\leq 1) \tag{2}$$

$$y=0.6 \tag{3}$$

$$x=1 \tag{4}$$

Furthermore, the second region is within a range enclosed by straight lines indicated by the following equations (5) to (8):

$$y=-5x+1.35, (x\leq 0.25) \tag{5}$$

$$y=-(1/15)x+7/60, (0.25\leq x\leq 1) \tag{6}$$

$$y=0.6 \tag{7}$$

$$x=1 \tag{8}$$

where y=(S−W)/W, x=$(\Gamma_s/d_s)/(\Gamma_a/d_a)$

Semiconductor laser devices satisfying the conditions within the first region have a θ value of not more than 0.8, and can stably generate self-sustained pulsation. Semiconductor laser device satisfying the conditions within the second region have a θ value of not more than 0.6, and can more stably generate self-sustained pulsation.

From the result of the measurements, there is such a tendency that low-noise characteristics are obtained if the light intensity per unit thickness of the saturable light absorbing layer 6 becomes higher than the light intensity per unit thickness of the active layer 4 (the value on the horizontal axis becomes larger), and low-noise characteristics are obtained if a larger part of the light spot size S spreads out the current confinement width W (the value on the vertical axis becomes larger).

From the graph in FIG. 4, the thickness $d_a$ of the active layer 4, the optical confinement factor $\Gamma_a$ of the active layer 4, the thickness $d_s$ of the saturable light absorbing layer 6, the optical confinement factor $\Gamma_s$ of the saturable light absorbing layer 6, and the light spot size S on the facet of the semiconductor laser device need to be so set as to satisfy the conditions within the first region or the second region in order to obtain stable self-sustained pulsation at a γ value of not more than 0.8 or a γ value of not more than 0.6. If this design method is used, therefore, it is possible to determine a structure in which the semiconductor laser device can stably generate self-sustained pulsation without actually fabricating devices.

Figure 5:
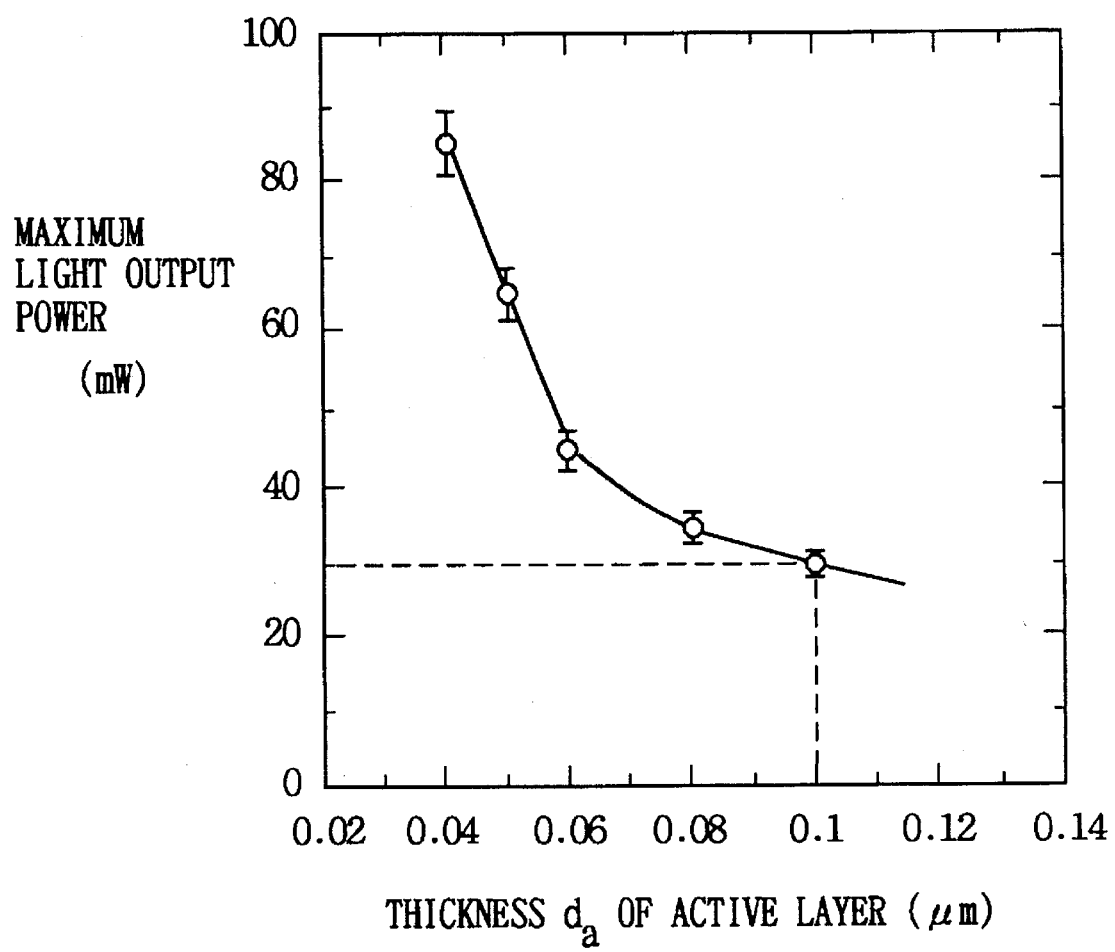
FIG. 5 is a diagram showing the relationship between the maximum light output power and the thickness of an active layer.

The relationship between the thickness $d_a$ of the active layer 4 and the maximum light output power was measured under the conditions for stably carrying out the self-sustained pulsation at a γ value of not more than 0.6, that is, the conditions within the second region shown in FIG. 4. FIG. 5 shows the results of the measurements. The maximum light output power is obtained by lasing the semiconductor laser device in a single mode with the value of the injected current being not less than the value of a region where the semiconductor laser device can generate self-sustained pulsation.

FIG. 5 shows that the maximum light output power becomes approximately 30 mW required at the time of recording in a general optical disk system if the thickness $d_a$ of the active layer 4 is not more than 0.1 μm, and the smaller the thickness $d_a$ is, the larger the maximum light output power is.

Consequently, the conditions allowing stable self-sustained pulsation characteristics and high-power characteristics to be selected by selecting the value of the injected current are the conditions under which the conditions within the second region shown in FIG. 4 are satisfied, and the thickness $d_a$ of the active layer 4 is not more than 0.1 μm.

The relationship between the ratio of the thickness $d_s$ of the saturable light absorbing layer 6 to the thickness $d_a$ of the active layer 4 and the lasing threshold current was measured under the conditions for stably generating the self-sustained pulsation at a θ value of not more than 0.6, that is, the conditions within the second region shown in FIG. 4.

Figure 6:
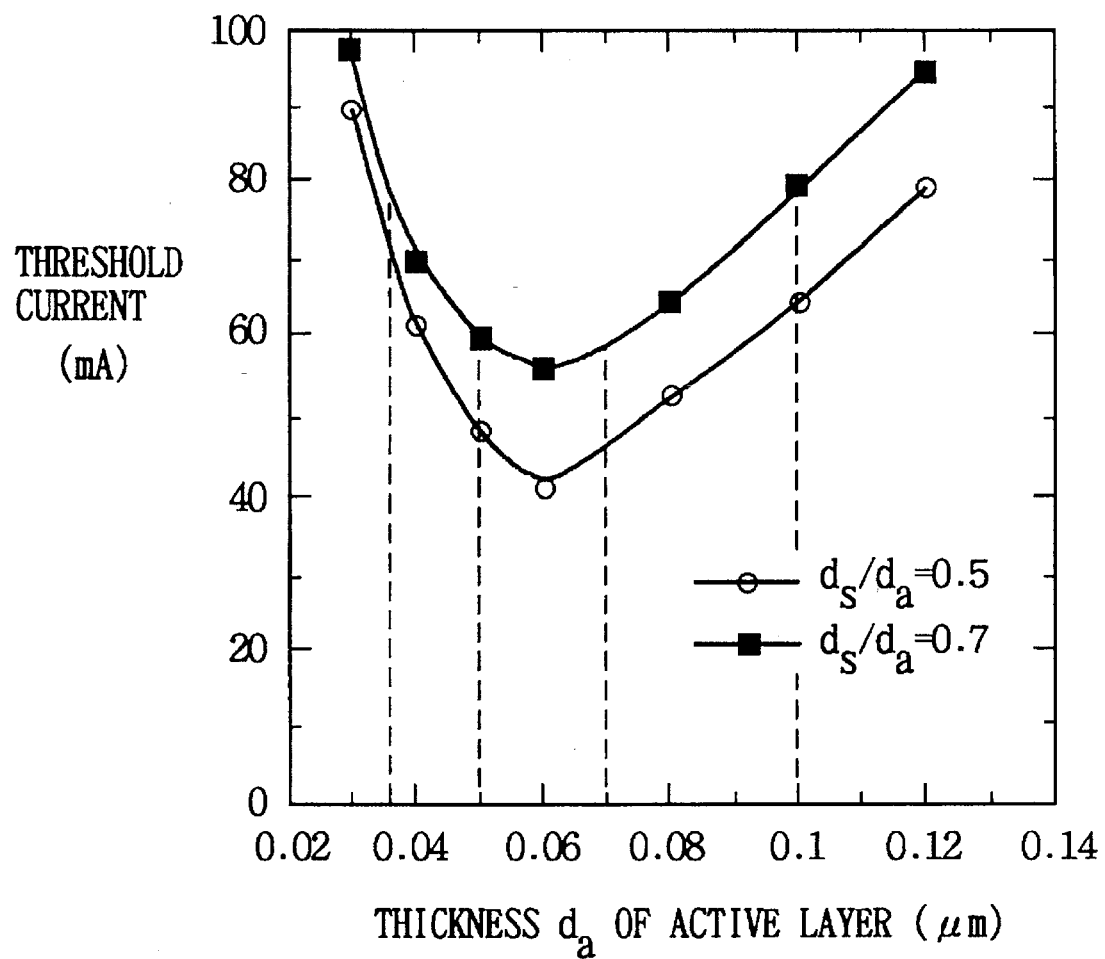
FIG. 6 is a diagram showing the relationship between a lasing threshold current and the thickness of an active layer.

FIG. 6 shows that the thickness $d_a$ of the active layer 4 must be not less than 0.035 μm not more than 0.1 μm in order to reduce threshold current to not more than approximately 80 mA, is preferably not less than 0.05 μm not more than 0.07 μm in order to further reduce the threshold current, and is most preferably approximately 0.06 μm.

From the results of FIGS. 4, 5 and 6, therefore, the conditions allowing stable self-sustained pulsation characteristics and high-power characteristics of not less than 30 mW to be selected by selecting the value of the injected current while reducing the threshold current to not more than approximately 80 mA are the conditions under which the conditions within the second region shown in FIG. 4 are satisfied, and the thickness $d_a$ of the active layer 4 is set to not less than 0.035 μm not more than 0.1 μm, is preferably not less than 0.05 μm not more than 0.07 μm, and is most preferably approximately 0.06 μm.

Figure 7:
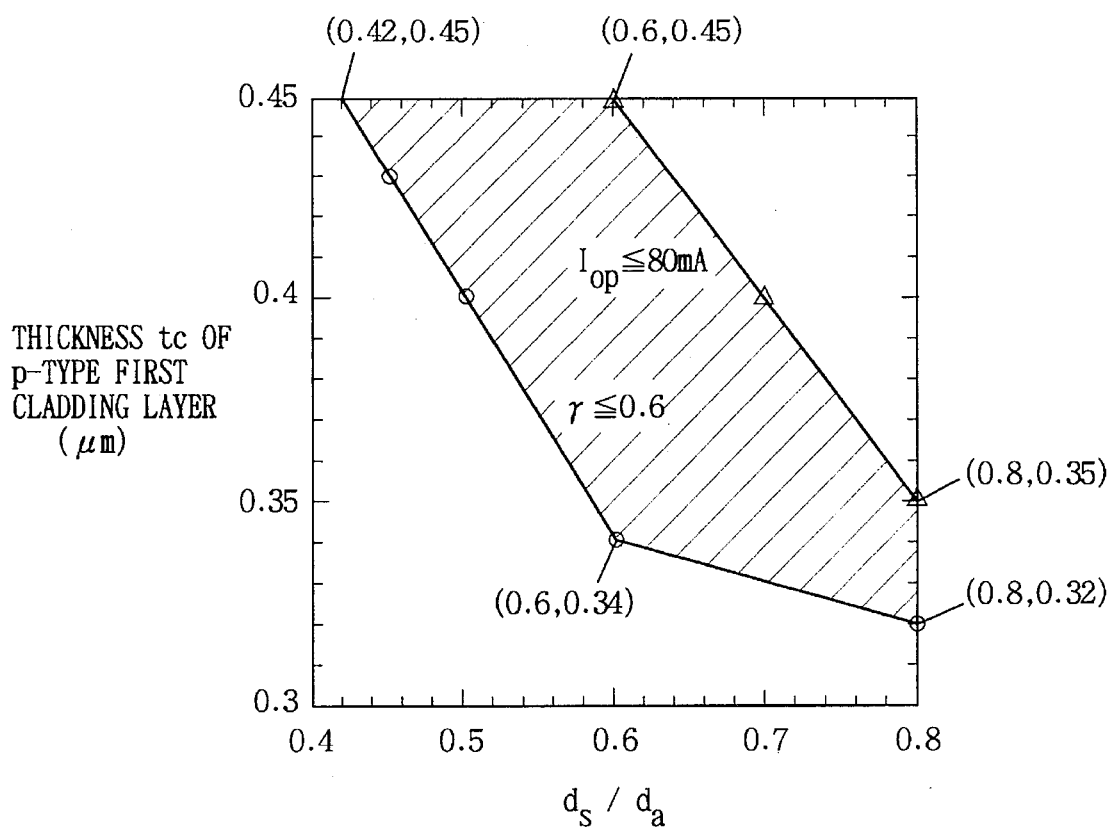
FIG. 7 is a diagram showing a region where $\gamma \leq 0.6$ and operating current is not more than 80 mA.

Furthermore, the conditions under which operating current $I_{op}$ is not more than 80 mA in a case where the semiconductor laser device stably generates self-sustained pulsation at a γ value of not more than 0.6 at the time of light output power of 3 mW was examined. FIG. 7 shows the results. The horizontal axis of a graph in FIG. 7 represents the ratio of the thickness $d_s$ of the saturable light absorbing layer 6 to the thickness $d_a$ of the active layer 4, and the vertical axis thereof represents the thickness $t_c$ of the p-type first cladding layer 5. In a region indicated by oblique hatching in FIG. 7, the θ value is not more than 0.6, and the operating current $I_{op}$ is not more than 80 mA.

The above described region indicated by oblique hatching is a range enclosed by straight lines indicated by the following equations (9) to (13):

$$t_c=0.45 \tag{9}$$

$$d_s/d_a 0.8 \tag{10}$$

$$t_c=-(3/5)\times(d_s/d_a)+7/10, d_s/d_a\leq 0.6 \tag{11}$$

$$t_c=-(1/10)\times(d_s/d_a)+2/5, 0.6\leq d_s/d_a\leq 0.8 \tag{12}$$

$$t_c=-(1/2)\times(d_s/d_a)+3/4, 0.6\leq d_s/d_a\leq 0.8 \tag{13}$$

If the thickness $t_c$ of the p-type first cladding layer 5 exceeds 0.45 μm, a transverse mode becomes unstable. In addition, the larger the value of $d_s/d_a$ is, the larger the operating current $I_{op}$ is. The operating current $I_{op}$ is considerably increased if the value of $d_s/d_a$ exceeds 0.8. Consequently, the thickness $t_c$ of the p-type first cladding layer 5 is preferably not more than 0.45 μm represented by the equation (9), and the value of $d_s/d_a$ is preferably not more than 0.8 represented by the equation (10).

Furthermore, in order that the semiconductor laser device can stably generate the self-sustained pulsation at light output power of more than 30 mW (for example, 45 mW), it is preferable that the thickness $d_a$ of the active layer 4 is not more than approximately 0.06 μm from the results of FIG. 5. Further, in order that the operating current $I_{op}$ at the time of light output power of 3 mW is not more than 80 mA, the threshold current must be lower than 80 mA by some extent (for example, approximately 70 mA). Consequently, it is preferable that the thickness $d_a$ of the active layer 4 is not less than 0.04 μm from the results of FIG. 6.

From the foregoing results, the thickness $t_c$ of the p-type first cladding layer 5, the thickness $d_a$ of the active layer 4, and the thickness $d_s$ of the saturable light absorbing layer 6 need to satisfy the conditions within the region indicated by oblique hatching in FIG. 7, and the thickness $d_a$ of the active layer 4 is approximately 0.04 μm to approximately 0.06 μm, in order that high output power of not less than 30 mW and stable self-sustained pulsation at a γ value of not more than 0.6 can be selected, and the operating current $I_{op}$ at the time of light output power of 3 mW is not more than 80 mA. The Al composition ratio X in the p-type first cladding layer 5 is generally not less than approximately 0.4 not more than approximately 0.6.

Semiconductor laser devices constructed using various structures or various materials satisfying the first region or the second region shown in FIG. 4 can stably generate self-sustained pulsation respectively at a θ value of not more than 0.8 or at a value γ of not more than 0.6 at the time of low light output power of 3 mW when the injected current is decreased. In the case of a semiconductor laser device comprising an active layer having no quantum well structure, higher power can be also achieved by setting the thickness of the active layer to the same value as described above (preferably, not more than 0.1 μm). Also in the case of a semiconductor laser device comprising an active layer having a quantum well structure, higher power can be achieved by setting the thickness of an active layer to the same value as described above (preferably, not more than 0.1 μm). The quantum well structure may be a multiquantum well structure or a single quantum well structure.

If there are a plurality of saturable light absorbing layers, the optical confinement factor $\Gamma_s$ is defined as one obtained by adding optical confinement factors $\Gamma$ of the saturable light absorbing layers. If the saturable light absorbing layers have a quantum well structure, the optical confinement factor $\Gamma$ of each of the saturable light absorbing layers is defined as one obtained by adding the optical confinement factors $\Gamma$ of respective well layers. Further, the active layer is defined as one or a plurality of layers interposed between an n-type cladding layer and a p-type cladding layer.

The conditions in the first embodiment are also applicable to semiconductor laser devices according to second to fifth embodiments having structures shown in FIGS. 8 to 11. The conditions of the semiconductor laser devices are the same as those in the first embodiment except that the position of a saturable light absorbing layer differs. Consequently, the same or corresponding portions as those in the first embodiment are assigned the same reference numerals and hence, the description thereof is not repeated. In FIGS. 8 to 11, illustration of a p-side electrode and an n-side electrode is omitted.

Figure 8:
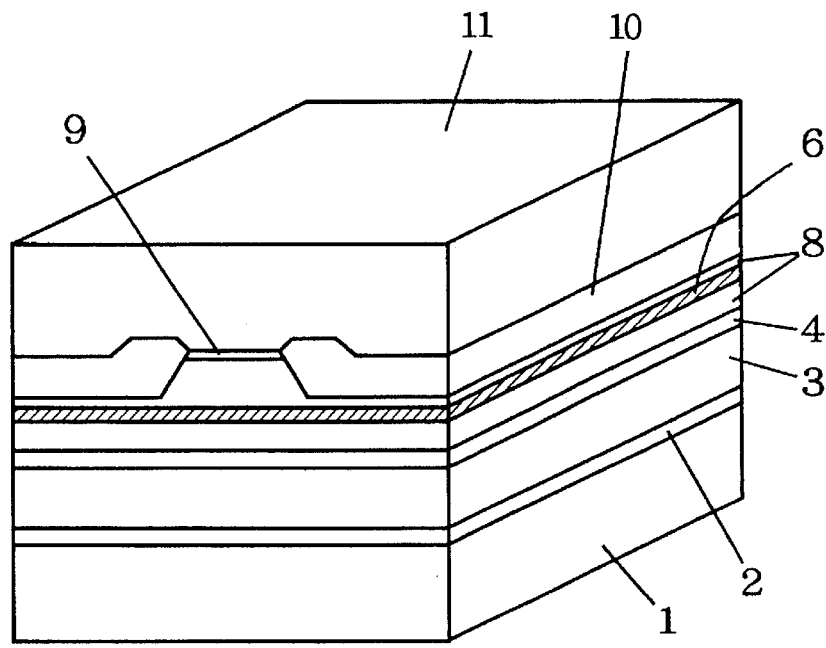
FIG. 8 is a perspective view showing a semiconductor laser device according to a second embodiment of the present invention.

The semiconductor laser device according to the second embodiment shown in FIG. 8 is common to that in the first embodiment in that a p-type saturable light absorbing layer 6 is in a p-type cladding layer 8, while differing from that in the first embodiment in that the p-type saturable light absorbing layer 6 is not an etching stop layer in forming a ridge portion.

Figure 9:
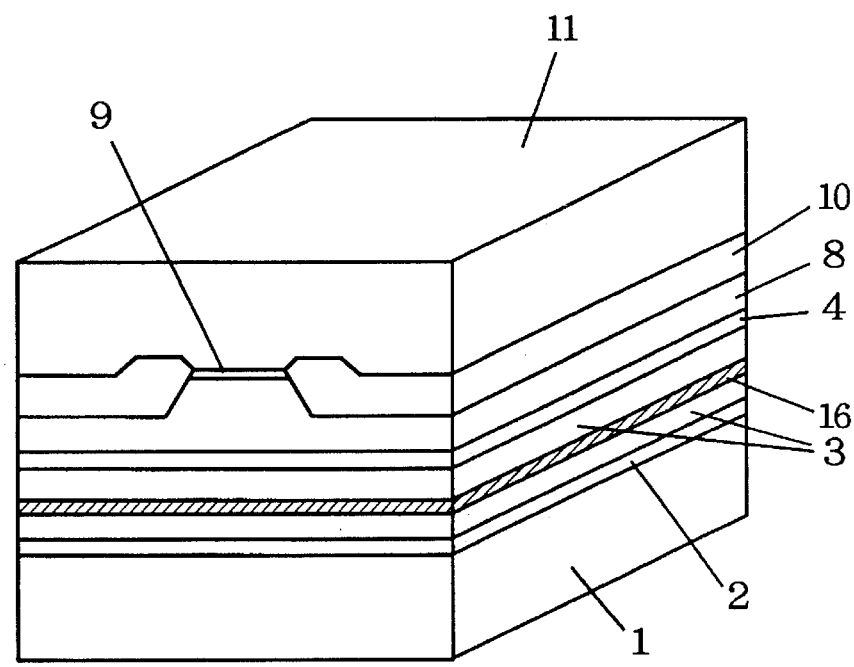
FIG. 9 is a perspective view showing a semiconductor laser device according to a third embodiment of the present invention.

The semiconductor laser device according to the third embodiment shown in FIG. 9 differs from that in the first embodiment in that there is no saturable light absorbing layer in a p-type cladding layer 8, and an n-type saturable light absorbing layer 16 is provided in an n-type cladding layer 3.

Figure 10:
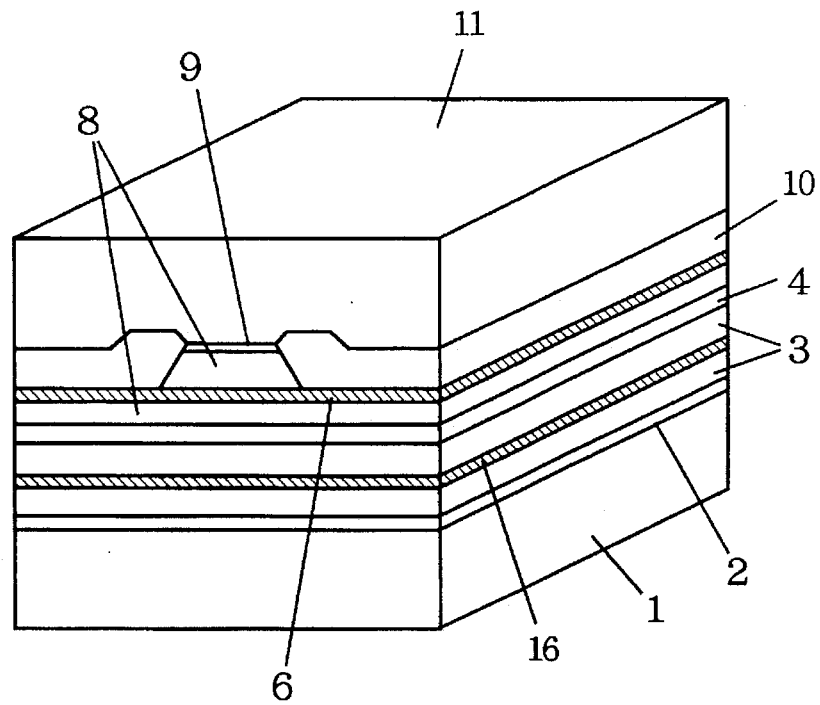
FIG. 10 is a perspective view showing a semiconductor laser device according to a fourth embodiment of the present invention.

The semiconductor laser device according to the fourth embodiment shown in FIG. 10 differs from that in the first embodiment in that an n-type saturable light absorbing layer 16 is further provided in an n-type cladding layer 3.

Figure 11:
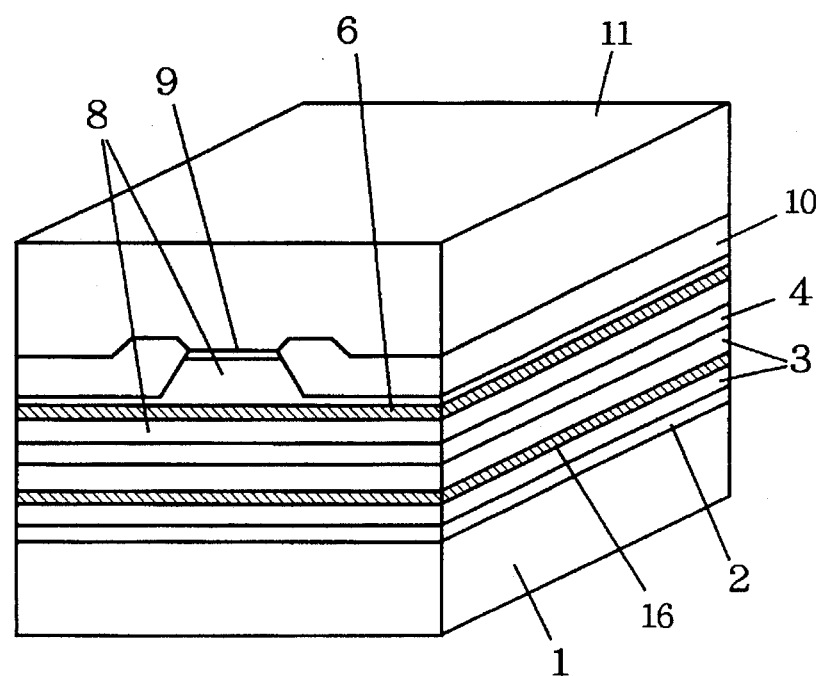
FIG. 11 is a perspective view showing a semiconductor laser device according to a fifth embodiment of the present invention.

The semiconductor laser device according to the fifth embodiment shown in FIG. 11 differs from that in the second embodiment in that an n-type saturable light absorbing layer 16 is further provided in an n-type cladding layer 3.

The conditions in the first embodiment are also applicable to semiconductor laser devices according to sixth to ninth embodiments having structures shown in FIGS. 12 to 15. Table 1 and Table 2 illustrate one example of the conditions of the semiconductor laser devices according to the embodiments. In the embodiments, an active layer 4 has a quantum well structure. The active layer 4 is constructed by laminating an $Al_{0.35}Ga_{0.65}As$ optical guide layer having a thickness of 240 Å, an $Al_{0.11}Ga_{0.89}As$ well layer having a thickness of 100 Å, an $Al_{0.35}Ga_{0.65}As$ barrier layer having a thickness of 80 Å, an $Al_{0.11}Ga_{0.89}As$ well layer having a thickness of 100 Å, an $Al_{0.35}Ga_{0.65}As$ barrier layer having a thickness of 80 Å, an $Al_{0.11}Ga_{0.89}As$ well layer having a thickness of 100 Å, and an $Al_{0.35}Ga_{0.65}As$ optical guide layer having a thickness of 240 Å in this order. The same or corresponding portions as those in the first to fifth embodiments are assigned the same reference numerals and hence, the description thereof is not repeated. In FIGS. 12 to 15, illustration of a p-side electrode and an n-side electrode is omitted.

TABLE 1

|  | sixth embodiment | seventh embodiment |
|---|---|---|
| n-type buffer layer 2 | GaAs<br>1 μm thickness | GaAs<br>1 μm thickness |
| n-type cladding layer 3 | $Al_{0.5}Ga_{0.5}As$<br>1.5 μm thickness | $Al_{0.45}Ga_{0.55}As$<br>1.5 μm thickness |
| p-type cladding layer 8 (lower side of layer 6) | $Al_{0.5}Ga_{0.5}As$<br>t = 0.34 μm<br>t' = 0.36 μm | $Al_{0.45}Ga_{0.55}As$<br>t = 0.34 μm<br>t' = 0.36 μm |
| p-type saturable light absorbing layer 6 | $Al_{0.11}Ga_{0.89}As$<br>0.015 μm thickness | $Al_{0.11}Ga_{0.89}As$<br>0.015 μm thickness |
| p-type etching stop layer 17 | — | $Al_{0.7}Ga_{0.3}As$<br>0.02 μm thickness |
| p-type cladding layer 8 (upper side of layer 6) | $Al_{0.5}Ga_{0.5}As$<br>0.7 μm thickness | $Al_{0.45}Ga_{0.55}As$<br>0.7 μm thickness |
| p-type cap layer 9 | GaAs<br>0.3 μm thickness | GaAs<br>0.3 μm thickness |
| n-type current blocking layer 10 | GaAs<br>0.8 μm thickness | GaAs<br>0.8 μm thickness |
| n-type anti-oxidation layer 18 | — | — |
| p-type contact layer 11 | GaAs<br>6 μm thickness | GaAs<br>6 μm thickness |

TABLE 2

|  | eighth embodiment | ninth embodiment |
|---|---|---|
| n-type buffer layer 2 | GaAs<br>1 μm thickness | GaAs<br>1 μm thickness |
| n-type cladding layer 3 | $Al_{0.5}Ga_{0.5}As$<br>1.5 μm thickness | $Al_{0.45}Ga_{0.55}As$<br>1.5 μm thickness |
| p-type cladding layer 8<br>(lower side of layer 6) | $Al_{0.5}Ga_{0.5}As$<br>t = 0.13 μm<br>t' = 0.15 μm | $Al_{0.45}Ga_{0.55}As$<br>t = 0.13 μm<br>t' = 0.15 μm |
| p-type saturable light<br>absorbing layer 6 | $Al_{0.11}Ga_{0.89}As$<br>0.01 μm thickness | $Al_{0.11}Ga_{0.89}As$<br>0.01 μm thickness |
| p-type etching<br>stop layer 17 | — | $Al_{0.7}Ga_{0.3}As$<br>0.02 μm thickness |
| p-type cladding layer 8<br>(upper side of layer 6) | $Al_{0.5}Ga_{0.5}As$<br>0.7 μm thickness | $Al_{0.45}Ga_{0.55}As$<br>0.7 μm thickness |
| p-type cap layer 9 | $Al_{0.7}Ga_{0.3}As$<br>0.3 μm thickness | $Al_{0.7}Ga_{0.3}As$<br>0.3 μm thickness |
| n-type current<br>blocking layer 10 | $Al_{0.7}Ga_{0.3}As$<br>0.5 μm thickness | $Al_{0.7}Ga_{0.3}As$<br>0.5 μm thickness |
| n-type anti-oxidation<br>layer 18 | GaAs<br>0.2 μm thickness | GaAs<br>0.2 μm thickness |
| p-type contact layer 11 | GaAs<br>6 μm thickness | GaAs<br>6 μm thickness |

Figure 12:
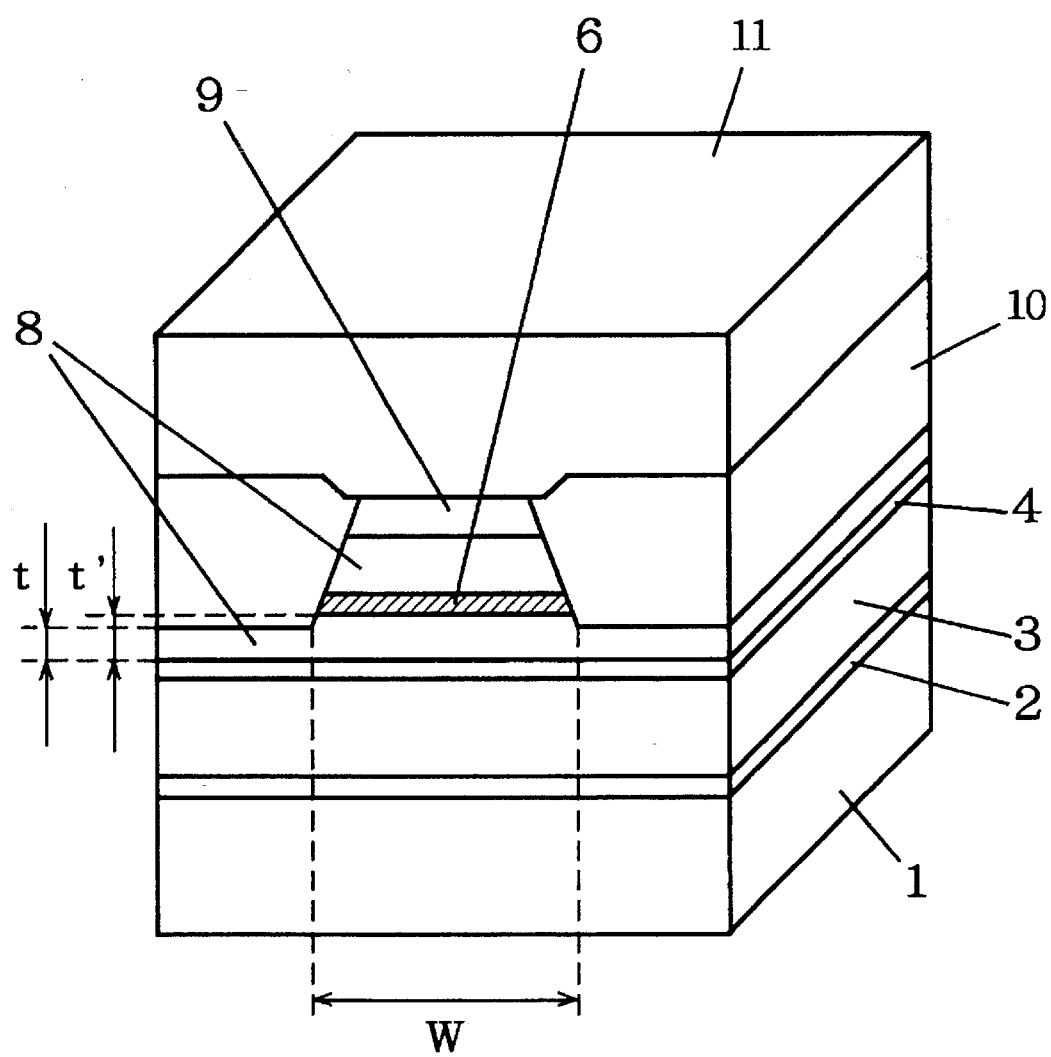
FIG. 12 is a perspective view showing a semiconductor laser device according to a sixth embodiment of the present invention.

The semiconductor laser device according to the sixth embodiment shown in FIG. 12 differs from those in the first to fifth embodiments in that a p-type $Al_{0.11}Ga_{0.89}As$ saturable light absorbing layer 6 is provided in a ridge portion of a p-type $Al_{0.5}Ga_{0.5}As$ cladding layer 8. In this structure, the optical density in the p-type saturable light absorbing layer 6 is increased, and the conditions under which the self-sustained pulsation can be generated are widened.

As light output power is increased, the frequency of the self-sustained pulsation is generally increased. In order to make the self-sustained pulsation possible at higher light output power, therefore, the frequency of the self-sustained pulsation at low light output power must be low. In the semiconductor laser device according to the sixth embodiment, the product of gain and $Γ_sJ$ (the volume of the saturable light absorbing layer) is increased, whereby the frequency of the self-sustained pulsation is decreased, thereby to make the self-sustained pulsation possible up to higher light output power, as compared with those in the first to fifth embodiments.

Furthermore, the p-type saturable light absorbing layer 6 exists only in the ridge portion, whereby the difference between the effective refractive index under the ridge portion and the effective refractive index under a flat portion becomes greater, as compared with that in a case where a p-type saturable light absorbing layer having the same width as that of the active layer 4 is provided in the p-type cladding layer 8. Therefore, the astigmatism can be decreased, and the transverse mode becomes more stable.

Figure 13:
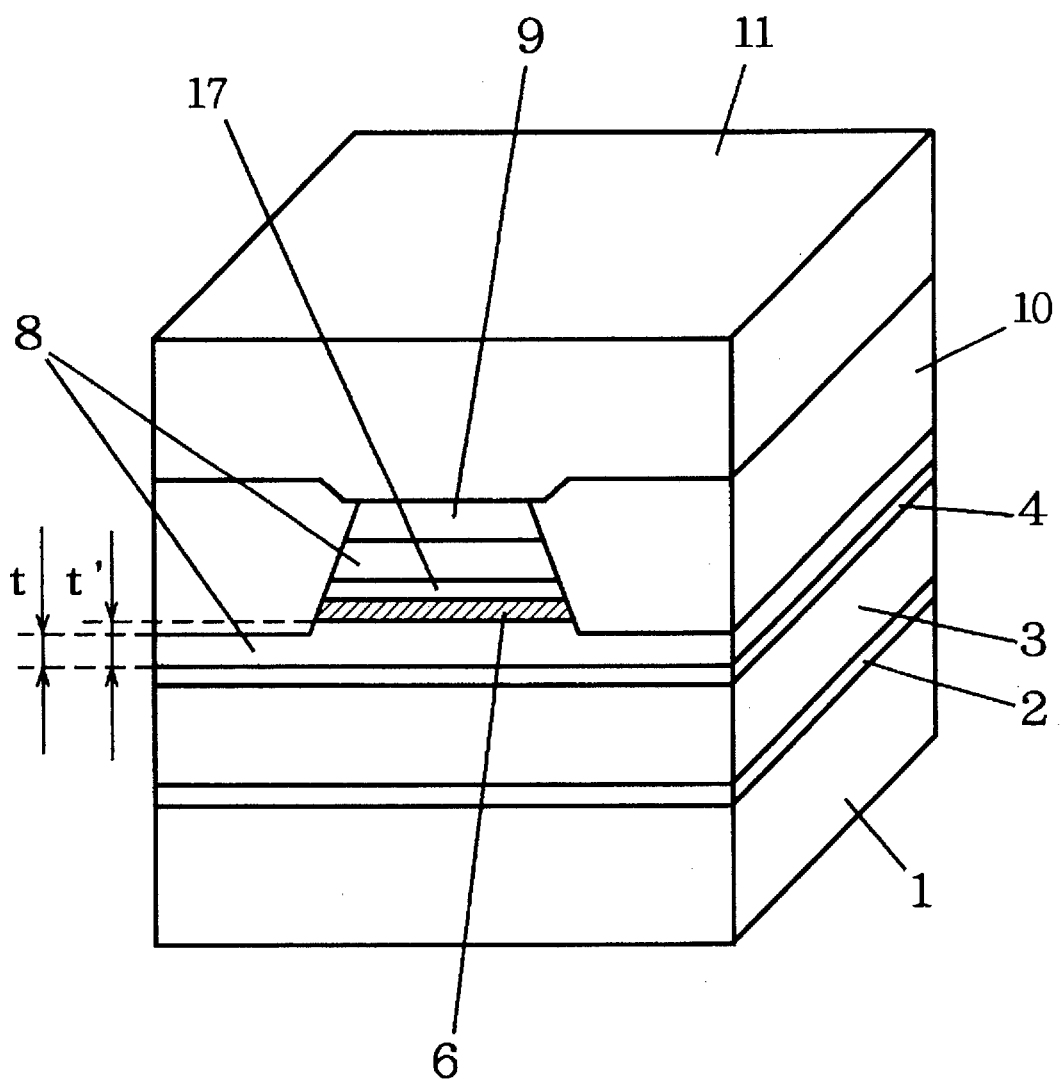
FIG. 13 is a perspective view showing a semiconductor laser device according to a seventh embodiment of the present invention.

The semiconductor laser device according to the seventh embodiment shown in FIG. 13 differs from that in the sixth embodiment in that a p-type $Al_{0.7}Ga_{0.3}As$ etching stop layer 17 is provided on a p-type $Al0.11Ga_{0.89}As$ saturable light absorbing layer 6. In fabricating the semiconductor laser device, etching is selectively made up to the etching stop layer 17 utilizing the difference in the Al composition ratio, after which the p-type saturable light absorbing layer 6 is etched, to form a ridge portion. Consequently, the thickness of a flat portion of a p-type cladding layer 8 can be controlled with higher precision, as compared with that in the sixth embodiment.

Figure 14:
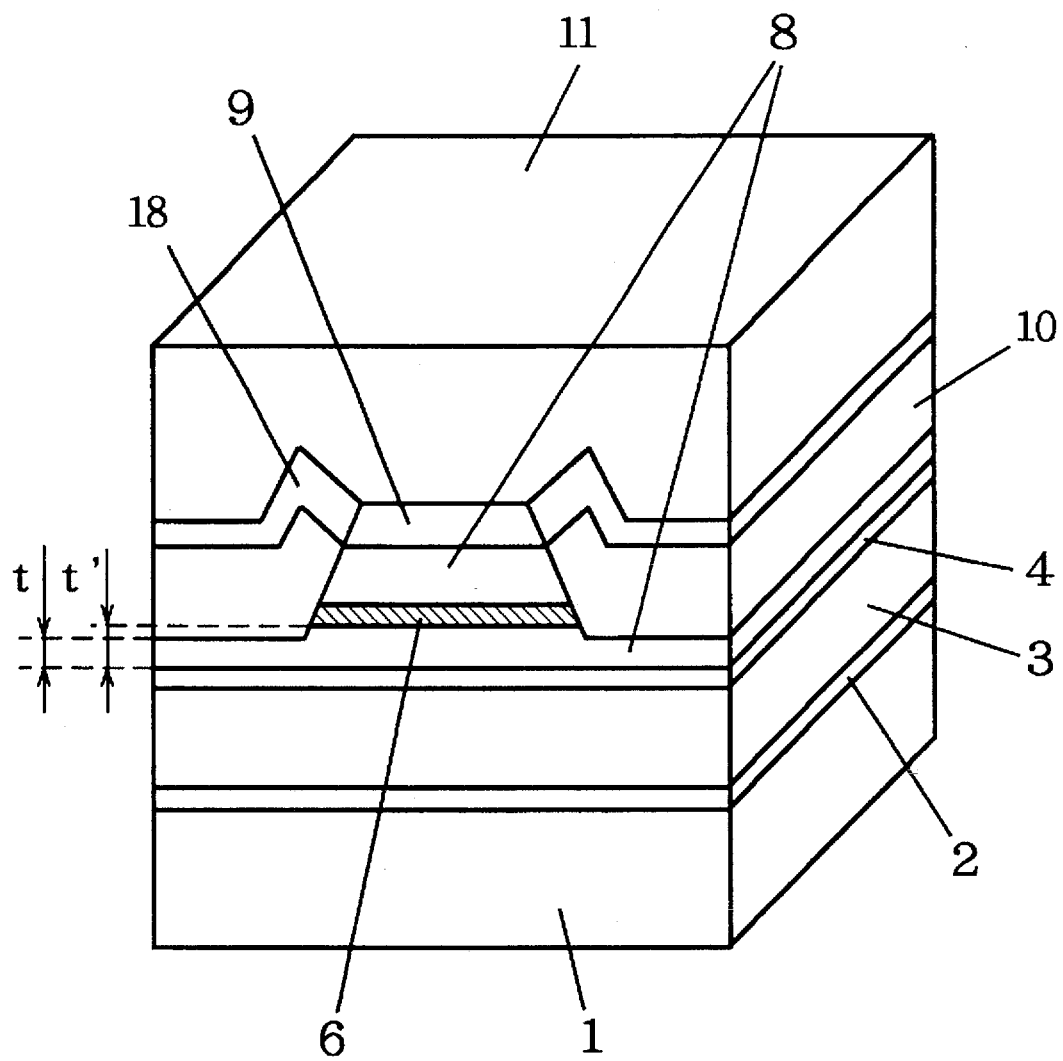
FIG. 14 is a perspective view showing a semiconductor laser device according to an eighth embodiment of the present invention.

The semiconductor laser device according to the eighth embodiment shown in FIG. 14 differs from that in the sixth embodiment in that an n-type $Al_{0.7}Ga_{0.3}As$ current blocking layer 10 having a larger band gap than that of a p-type $Al_{0.5}Ga_{0.5}As$ cladding layer 8 is used. In a semiconductor material of a III–V group including Al, the larger the Al composition ratio is, the larger the band gap is. Since the current blocking layer 10 having a large band gap is oxidized if it is exposed to air, an n-type GaAs anti-oxidation layer 18 for making good crystal growth is provided on the current blocking layer 10.

In the current blocking layer 10 having a larger band gap than that of the p-type cladding layer 8, the amount of light absorption is smaller than that in a GaAs current blocking layer, whereby the internal loss is reduced. Therefore, lower threshold current and higher efficiency can be achieved. In this structure, even if the thickness of a flat portion of the p-type cladding layer 8 is decreased, light is not absorbed by the current blocking layer 10, whereby the spot size is not decreased. Consequently, the thickness of the flat portion of the p-type cladding layer 8 can be considerably decreased, thereby to make it possible to reduce unavailing current flowing through the flat portion. As a result, it is possible to significantly reduce operating current while maintaining good low-noise characteristics as well as improve the maximum light output power.

Figure 15:
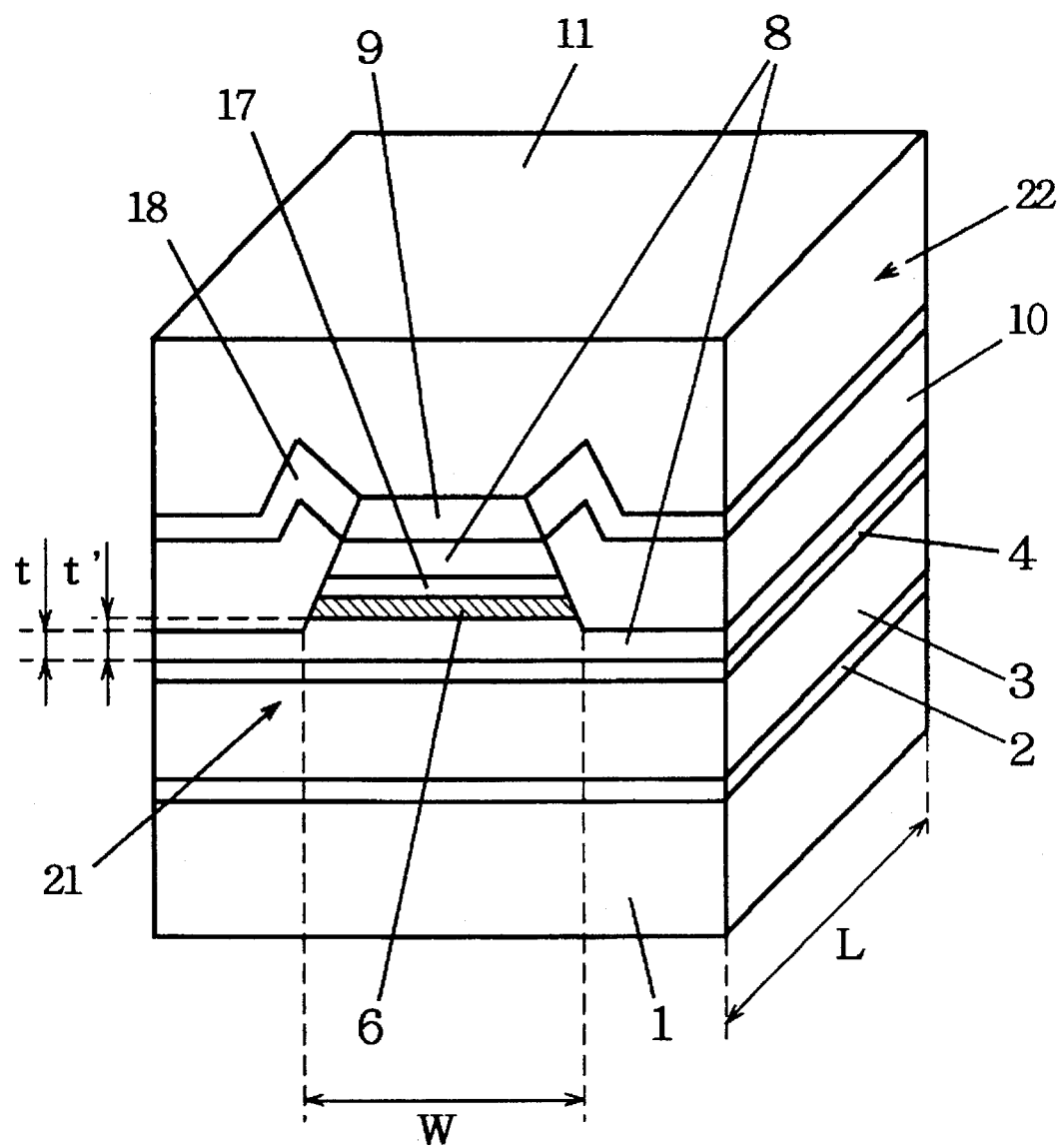
FIG. 15 is a perspective view showing a semiconductor laser device according to a ninth embodiment of the present invention.

A semiconductor laser device according to the ninth embodiment shown in FIG. 15 differs from that in the eighth embodiment in that a p-type $Al_{0.7}Ga_{0.3}As$ etching stop layer 17 is provided on a p-type $Al_{0.11}Ga_{0.89}As$ saturable light absorbing layer 6, as in the seventh embodiment.

Also in the semiconductor laser device according to the present embodiment, since a current blocking layer 10 having a large band gap is oxidized if it is exposed to air, as in the eighth embodiment, an n-type GaAs anti-oxidation layer 18 is provided on the current blocking layer 10 for making good crystal growth.

The following Table 3 shows the characteristics of the semiconductor laser devices according to the sixth to ninth embodiments.

TABLE 3

|  | sixth embodiment | seventh embodiment | eighth embodiment | ninth embodiment |
|---|---|---|---|---|
| γ value [at 3 mW] | 0.3 | 0.3 | 0.4 | 0.4 |
| astigmatism [at 3 mW] | 7 μm | 7 μm | 4 μm | 4 μm |
| maximum light output power | 60 mW | 60 mW | 80 mW | 90 mW |
| operating current [at 30 mW] | 130 mA | 135 mA | 85 mA | 80 mA |

Table 3 shows that in the sixth to ninth embodiments, the γ value is small, the astigmatism is small, the maximum light output power is considerably larger than 30 mW, and the operating current $I_{op}$ at the time of light output power of 30 mW is as small as approximately 130 mA or less. Particularly in the eighth and ninth embodiments in which the band gap of the current blocking layer 10 is larger than the band gap of the cladding layer 8, the astigmatism is as small as approximately 4 μm, the maximum light output power is increased to 80 mW or more, and the operating current $I_{op}$ is decreased to approximately 80 mA.

Also in the first to fifth embodiments, it goes without saying that a current blocking layer 10 having a larger band gap than that of the p-type cladding layer 8 may be used.

Furthermore, as the current blocking layer 10, an insulating material such as semi-insulating GaAs, semi-insulating AlGaAs, semi-insulating ZnSe, $SiO_2$, $SiN_4$ or $Al_2O_3$, or an insulating high polymer material such as polyimide may be used.

Description is now made of a semiconductor laser device according to the tenth embodiment of the present invention. The semiconductor laser device in the tenth embodiment has a structure shown in FIG. 15, similarly to that in the ninth embodiment. The semiconductor laser device in the tenth embodiment differs from that in the ninth embodiment in that the reflectivity of a light output facet 21 (hereinafter referred to as the front facet reflectivity) is set to not less than 10% not more than 20%.

The front facet reflectivity was changed to prepare a plurality of samples having the structure shown in FIG. 15, and the dependence of optical feedback noise characteristics on the front facet reflectivity at the time of light output power of 3 mW was examined. In the sample, the current confinement width W is 2.5 to 5.5 μm, the cavity length L is 350 μm, and the reflectivity of a rear facet 22 is 95%. The signal-to-noise ratio (S/N) was measured at room temperature by setting the optical path length to 50 mm and setting the optical feedback ratio to 0.1%. The measurements of the optical feedback noise characteristics were done under the condition of the central frequency of 720 kHz and the bandwidth of 10 kHz.

Figure 16:
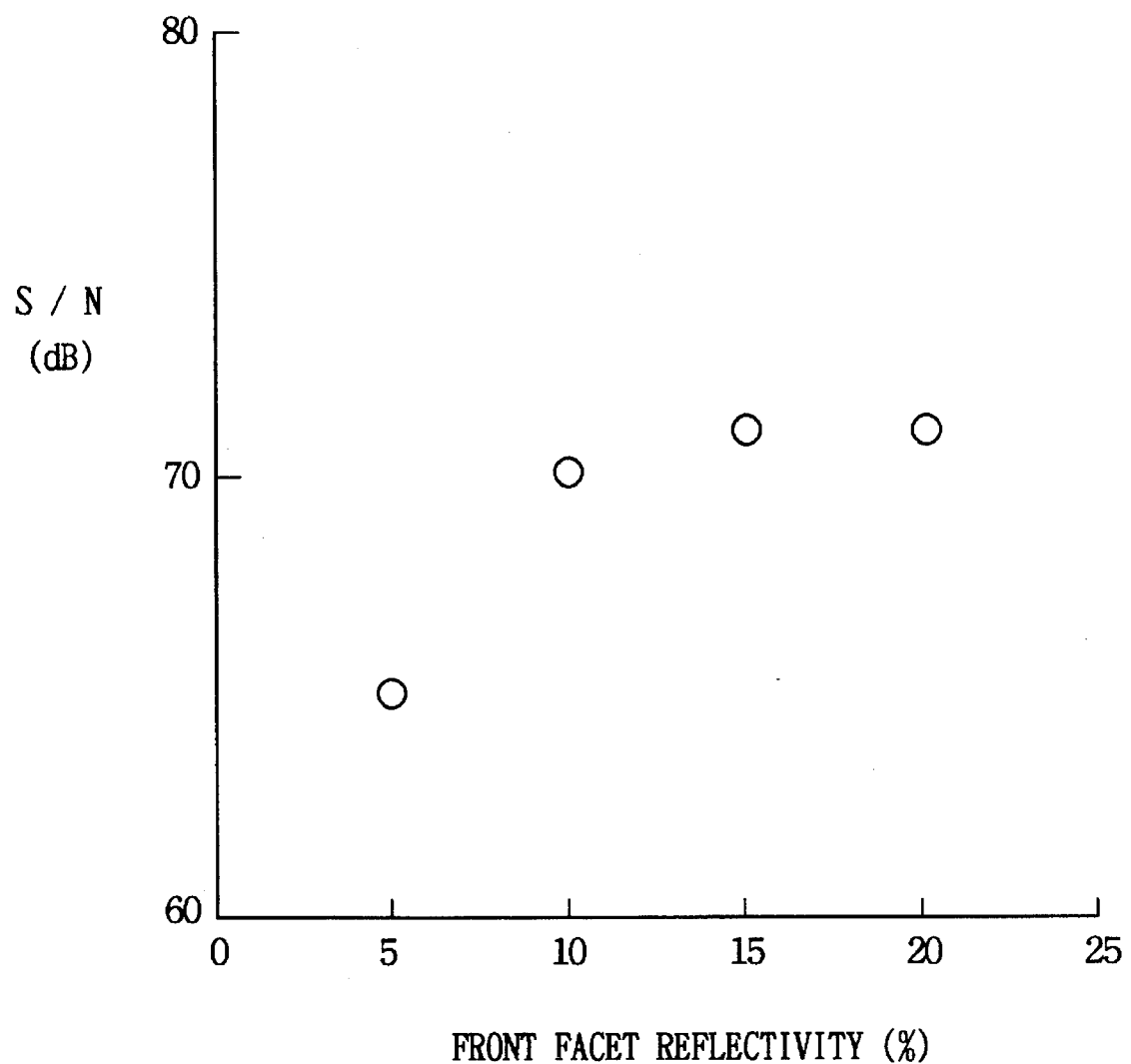
FIG. 16 is a diagram showing the results of measurements of the relationship between the front facet reflectivity and S/N.

FIG. 16 shows the results of measurements of the relationship between the front facet reflectivity and S/N. FIG. 16 shows that S/N is 65 dB if the front facet reflectivity is 5% as in the conventional example, while being not less than 70 dB if the front facet reflectivity is in the range of 10 to 20%.

Figure 17:
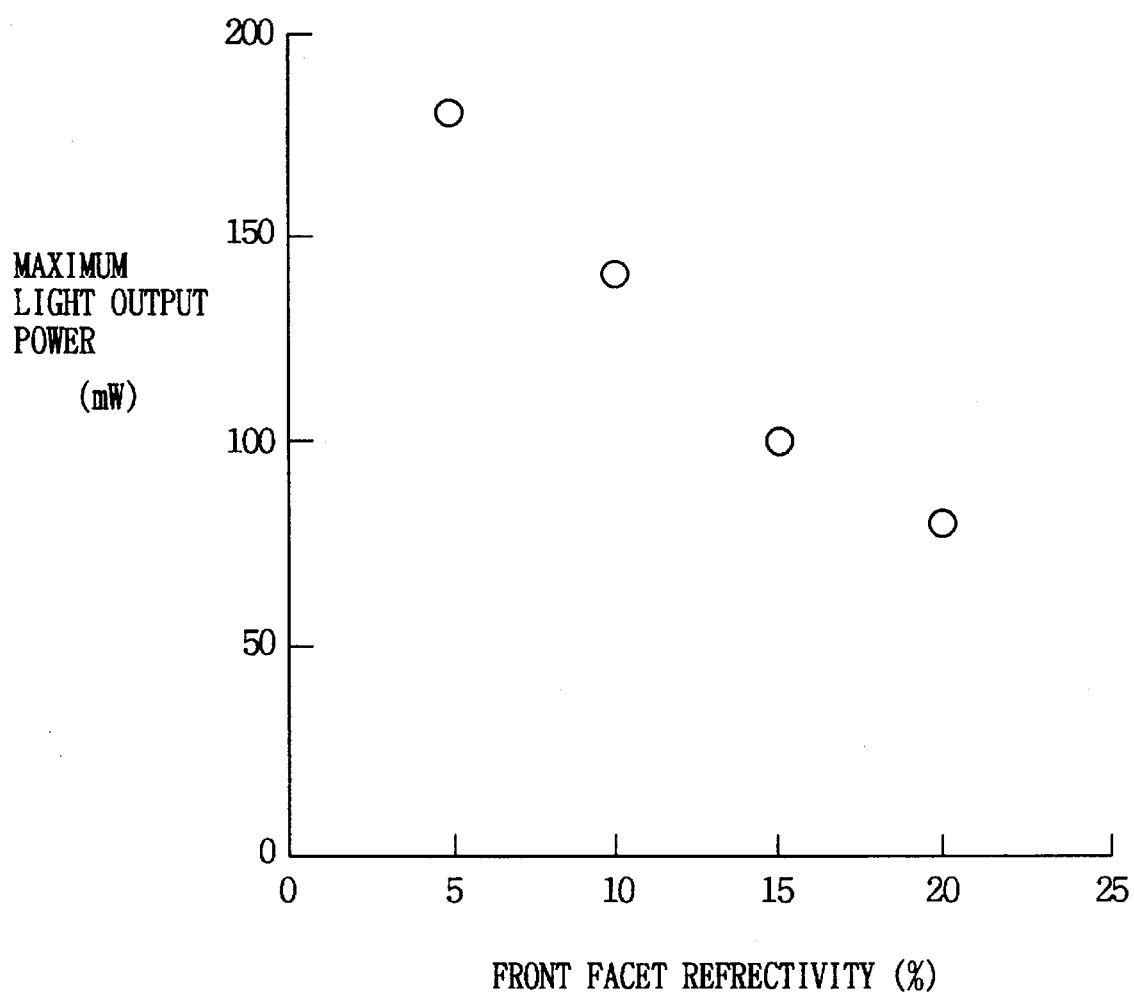
FIG. 17 is a diagram showing the results of measurements of the relationship between the front facet reflectivity and the maximum light output power.

In the same samples, the dependence of the maximum light output power on the front facet reflectivity was then examined. FIG. 17 shows the results of measurements of the relationship between the front facet reflectivity and the maximum light output power. FIG. 17 shows that the larger the front facet reflectivity is, the lower the maximum light output power is, whereas high output power of 140 mW and high output power of 100 mW are respectively obtained if the front facet reflectivity is 10% and 15%, and high output power of 80 mW is obtained if the front facet reflectivity is 20%.

The foregoing results prove that the front facet reflectivity must be not less than 10% not more than 20% in order to obtain good optical feedback noise characteristics in which S/N is not less than 70 dB and make high-power lasing of not less than 80 mW possible, and it is preferably not less than 10% not more than 15% in order to obtain higher-power lasing characteristics.

The conditions of the above described front facet reflectivity may be applied to the first to ninth embodiments. Also in this case, good optical feedback noise characteristics which are not dependent on the optical feedback ratio is obtained at the time of low light output power, and high-power lasing can be achieved.

Although it is preferable that the n-type buffer layer 2 is provided between the GaAs substrate 1 and the n-type cladding layer 3 as in the above described embodiment, the n-type buffer layer 2 dose not have to be provided.

The present invention is not limited to the above described AlGaAs semiconductor laser device. For example, the present invention is applicable to another semiconductor laser device, for example, an AlGaInP system semiconductor laser device. In addition, the present invention is not limited to the above described semiconductor laser device having a ridge structure. For example, the present invention is also applicable to another semiconductor laser device, for example, a self-alignment type semiconductor laser device. Also in the case of the semiconductor laser device having another structure, the current confinement width W is defined as the current confinement width in an active layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of designing a semiconductor laser device comprising the steps of:

providing a device having a cladding layer of a first conductivity type, an active layer which is formed on said cladding layer of a first conductivity type and into which current confined to a width W is injected, a cladding layer of a second conductivity type formed on said active layer, and a saturable light absorbing layer provided in at least one of both cladding layers, and setting the value of the thickness $d_a$ of said active layer, the optical confinement factor $\Gamma_a$ of said active layer, the thickness $d_s$ of said saturable light absorbing layer, the optical confinement factor $\Gamma_s$ of said saturable light absorbing layer, said current confinement width W, and the light spot size S on a facet of said semiconductor laser device to obtain stable self-sustained pulsation of said laser device.

2. The method according to claim 1, wherein said setting step includes setting the values of the thickness $d_a$ of said active layer, the optical confinement factor $\Gamma_a$ of said active layer, the thickness $d_s$ of said saturable light absorbing layer, the optical confinement factor $\Gamma_s$ of said saturable light absorbing layer, said current confinement width W, and said light spot size S in a range enclosed by lines defined by equations (A) to (D):

$$y=-ax+b \qquad (A)$$

$$y=-cx+d, (a>c, b>d) \qquad (B)$$

$$y=e \qquad (C)$$

$$x=f \qquad (D)$$

where a, b, c, d, e and f are each positive constants and $y=(S-W)/W$, $x=(\Gamma_s/d_s)/(\Gamma_a/d_a)$.

3. The method according to claim 2, wherein said setting step includes setting the thickness $d_a$ of said active layer, the optical confinement factor $\Gamma_a$ of said active layer, the thickness $d_s$ of said saturable light absorbing layer, the optical confinement factor $\Gamma_s$ of said saturable light absorbing layer, said current confinement width W and said light spot size S in a range enclosed by lines defined by equations (1) to (4):

$$y=-5x+1.3, (x \leq 0.25) \qquad (1)$$

$$y=-(1/25)x+3/50, (0.25 \leq x \leq 1) \qquad (2)$$

$$y=0.6 \qquad (3)$$

$$x=1 \qquad (4)$$

where $y=(S-W)/W$, $x=(\Gamma_s/d_s)/(\Gamma_a/d_a)$.

4. The method according to claim 3, wherein said setting step includes setting the thickness $d_a$ of said active layer, the optical confinement factor $\Gamma_a$ of said active layer, the thickness $d_s$ of said saturable light absorbing layer, the optical confinement factor $\Gamma_s$ of said saturable light absorbing layer, said current confinement width W, and said light spot size S in a range enclosed by lines defined by equations (5) to (8):

$$y=-5x+1.35, (x \leq 0.25) \quad (5)$$

$$y=-(1/15)x+7/60, (0.25 \leq x \leq 1) \quad (6)$$

$$y=0.6 \quad (7)$$

$$x=1 \quad (8)$$

where $y=(S-W)/W$, $x=(\Gamma_s/d_s)/(\Gamma_a/d_a)$.

5. The method according to claim 1, wherein said setting step includes setting the width of said saturable light absorbing layer to be smaller than the width of said active layer.

6. The method according to claim 1, wherein said setting step includes setting the thickness of said active layer to not more than 0.1 μm.

7. The method according to claim 6, wherein said setting step includes setting the thickness of said active layer to not less than 0.035 μm and not more than 0.1 μm.

8. The method according to claim 1, wherein said step of providing includes selecting an $Al_xGa_{1-x}As$ cladding layer of a first conductivity type as said cladding layer of a first conductivity type, selecting an $Al_xGa_{1-x}As$ first cladding layer of said second conductivity type formed on said active layer and an $Al_xGa_{1-x}As$ second cladding layer of a second conductivity type constituting a stripe-shaped ridge portion formed on said first cladding layer as said cladding layer of a second conductivity type, and selecting a saturable light absorbing layer of a second conductivity type formed between said first cladding layer and said second cladding layer as said saturable light absorbing layer, and providing for a current blocking layer of a first conductivity type provided on a side surface of said ridge portion and on said saturable light absorbing layer, and said setting step includes setting the thickness $d_a$ of said active layer, the thickness $d_s$ of said saturable light absorbing layer, and the thickness $t_c$ of said first cladding layer in a range enclosed by lines defined by equations (9) to (13):

$$t_c=0.45 \quad (9)$$

$$d_s/d_a=0.8 \quad (10)$$

$$t_c=-(3/5) \times (d_s/d_a)+7/10, d_s/d_a \leq 0.6 \quad (11)$$

$$t_c=-(1/10) \times (d_s/d_a)+2/5, \leq 0.6 d_s/d_a \leq 0.8 \quad (12)$$

$$t_c=-(1/2) \times (d_s/d_a)+3/4, 0.6 \leq d_s/d_a \leq 0.8 \quad (13)$$

setting the thickness $d_a$ of said active layer in a range between about 0.04 μm and about 0.06 μm, and setting the composition ratio X in said cladding layer of a first conductivity type in a range of between about 0.4 and about 0.6.

9. A semiconductor laser device comprising:

an $Al_xGa_{1-x}As$ cladding layer of a first conductivity type;

an active layer formed on said cladding layer of a first conductivity type;

an $Al_xGa_{1-x}As$ first cladding layer of a second conductivity type formed on said active layer;

a saturable light absorbing layer of a second conductivity type formed on said first cladding layer;

an $Al_xGa_{1-x}As$ second cladding layer of a second conductivity type constituting a stripe-shaped ridge portion formed on said saturable light absorbing layer; and a current blocking layer of a first conductivity type provided on a side surface of said ridge portion and on said saturable light absorbing layer, the thickness $d_a$ of said active layer, the thickness $d_s$ of said saturable light absorbing layer, and the thickness $t_c$ of said first cladding layer satisfying conditions in a range enclosed by straight lines indicated by equations (9) to (13):

$$t_c=0.45 \quad (9)$$

$$d_s/d_a=0.9 \quad (10)$$

$$t_c=-(3/5) \times (d_s/d_a)+7/10, d_s/d_a \leq 0.6 \quad (11)$$

$$t_c=-(1/10) \times (d_s/d_a)+2/5, 0.6 \leq d_s/d_a \leq 0.8 \quad (12)$$

$$t_c=-(1/2) \times (d_s/d_a)+3/4, 0.6 \leq d_s/d_a \leq 0.8 \quad (13)$$

the thickness $d_a$ of said active layer being not less than 0.04 μm not more than 0.06 μm, and the composition ratio X in said cladding layer of a first conductivity type being not less than 0.4 not more than 0.6.

10. A semiconductor laser device comprising:

a cladding layer of a first conductivity type;

an active layer which is formed on said cladding layer of a first conductivity type and into which current confined to a width W is injected;

a cladding layer of a second conductivity type comprising a flat portion formed on said active layer and a stripe-shaped ridge portion formed on a part of said flat portion; and a saturable light absorbing layer provided in said ridge portion or between said ridge portion and said flat portion and having a smaller width than that of said active layer, and wherein the thickness $d_a$ of said active layer, the optical confinement factor $\Gamma_a$ of said active layer, the thickness $d_s$ of said saturable light absorbing layer, the optical confinement factor $\Gamma_s$ of said saturable light absorbing layer, said current confinement width W, and the light spot size S on a facet of said semiconductor laser device satisfy conditions in a range enclosed by straight lines indicated by equations (1) to (4):

$$y=-5x+1.3, (x \leq 0.25) \quad (1)$$

$$y=-(1/25)x+3/50, (0.25 \leq x \leq 1) \quad (2)$$

$$y=0.6 \quad (3)$$

$$x=1 \quad (4)$$

where $y=(S-W)/W$, $x=(\Gamma_s/d_s)/(\Gamma_a/d_a)$.

11. The semiconductor laser device according to claim 10, wherein the thickness $d_a$ of said active layer, the optical confinement factor $\Gamma_a$ of said active layer, the thickness $d_s$ of said saturable light absorbing layer, the optical confinement factor $\Gamma_s$ of said saturable light absorbing layer, said current confinement width W, and said light spot size S satisfy conditions in a range enclosed by straight lines indicated by equations (5) to 8):

$$y=-5x+1.35, (x \leq 0.25) \quad (5)$$

$$y=-(1/15)x+7/60, (0.25 \leq x \leq 1) \quad (6)$$

$$y=0.6 \quad (7)$$

$$x=1 \quad (8)$$

where $y=(S-W)/W$, $x=(\Gamma_s/d_s)/(\Gamma_a/d_a)$.

12. The semiconductor laser device according to claim 10, wherein said cladding layer of a first conductivity type is composed of $Al_xGa_{1-x}As$, said cladding layer of a second conductivity type is composed of $Al_xGa_{1-x}As$, and said active layer is composed of $Al_yGa_{1-y}As$ ($0 \leq Y<X<1$).

13. The semiconductor laser device according to claim 10, wherein the thickness of said active layer is not more than 0.1 μm.

14. The semiconductor laser device according to claim 13, wherein the thickness of said active layer is not less than 0.035 μm not more than 0.1 μm.

15. The semiconductor laser device according to claim 10, further comprising an etching stop layer of a second conductivity type formed on said saturable light absorbing layer.

16. The semiconductor laser device according to claim 10, further comprising a current blocking layer of a first conductivity type provided on a side surface of said ridge portion and on said flat portion and having a larger band gap than that of said cladding layer of a second conductivity type.

17. The semiconductor laser device according to claim 10, wherein the reflectivity of a facet on the side of light output of said semiconductor laser device is not less than 10% nor more than 20%.

18. A semiconductor laser device comprising:

a cladding layer of a first conductivity type;

an active layer formed on said cladding layer of a first conductivity type;

a cladding layer of a second conductivity type comprising a flat portion formed on said active layer and a stripe-shaped ridge portion formed on a part of said flat portion;

a saturable light absorbing layer provided in at least one of said cladding layer of a first conductivity type and said cladding layer of a second conductivity type, said saturable light absorbing layer being located at least in said ridge portion or in a region facing said ridge portion; and a current blocking layer of a first conductivity type provided on a side surface of said ridge portion and on said flat portion and having a larger band gap than that of said cladding layer of a second conductivity type.

19. The semiconductor laser device according to claim 18, wherein said cladding layer of a second conductivity type is composed of $Al_xGa_{1-x}As$, said active layer is composed of $Al_yGa_{1-y}As$, and said current blocking layer is composed of $Al_zGa_{1-z}As$, and $0 \leq Y<X<Z<1$.

20. The semiconductor laser device according to claim 19, further comprising an anti-oxidation layer of a first conductivity type formed on said current blocking layer.

21. The semiconductor laser device according to claim 18, wherein the reflectivity of a facet on the light output side is not less than 10% nor more than 20%.

22. The semiconductor laser device according to claim 18, wherein said saturable light absorbing layer is located at least in said ridge portion.

23. The semiconductor laser device according to claim 18, wherein said saturable light absorbing layer is located at least in said ridge portion, said semiconductor laser device further comprising an etching stop layer on said saturable light absorbing layer.

24. The semiconductor laser device according to claim 18, wherein said saturable light absorbing layer is located in said cladding layer of a second conductivity type, said semiconductor laser device further comprising an etching stop layer on said saturable light absorbing layer.

25. A semiconductor laser device comprising:

a cladding layer of a first conductivity type;

an active layer formed on said cladding layer of a first conductivity type;

a cladding layer of a second conductivity type formed on said active layer; and a saturable light absorbing layer provided in at least one of said cladding layer of a first conductivity type and said cladding layer of a second conductivity type, the reflectivity of a facet on the light output side being not less than 10% nor more than 20%.

26. The semiconductor laser device according to claim 25, wherein said saturable light absorbing layer is located in said cladding layer of a second conductivity type, said semiconductor laser device further comprising an etching stop layer on said saturable light absorbing layer.

27. A semiconductor laser device comprising:

a cladding layer of a first conductivity type, an active layer on said cladding layer of a first conductivity type and into which current confined to a width W is injected, a cladding layer of a second conductivity type on said active layer, a saturable light absorbing layer in at least one of said cladding layers, and a current blocking layer of a first conductivity type for confining current to said width W, provided on said cladding layer of a second conductivity type and having a larger band gap than the band gap of said cladding layer of a second conductivity type, said saturable light absorbing layer being located in a portion in which said current confined to said width W flows or at least in a region facing a portion in which said current confined to said width W flows.

* * * * *